United States Patent [19]
Sako

[11] Patent Number: 5,808,483
[45] Date of Patent: Sep. 15, 1998

[54] LOGIC CIRCUIT UTILIZING PASS TRANSISTORS AND LOGIC GATE

[75] Inventor: Norimitsu Sako, Chiba, Japan

[73] Assignee: Kawasaki Steel Corporation, Kobe, Japan

[21] Appl. No.: 716,883

[22] Filed: Sep. 20, 1996

[30] Foreign Application Priority Data

Sep. 22, 1995 [JP] Japan ................................. 7-244402
Dec. 4, 1995 [JP] Japan ................................. 7-220063

[51] Int. Cl.⁶ .......................... H03K 19/094; H03K 19/20
[52] U.S. Cl. .............................. 326/113; 326/21; 326/121
[58] Field of Search ................................ 326/113, 121, 326/21, 104

[56] References Cited

U.S. PATENT DOCUMENTS

| | | | |
|---|---|---|---|
| 3,739,193 | 6/1973 | Pryor | 326/113 |
| 4,541,067 | 9/1985 | Whitaker . | |
| 4,559,609 | 12/1985 | Robinson, Jr. et al. . | |
| 4,595,845 | 6/1986 | Briggs | 326/113 |
| 4,620,117 | 10/1986 | Fang | 326/113 |
| 4,633,220 | 12/1986 | Burgess | 326/113 |
| 4,870,302 | 9/1989 | Freeman . | |
| 5,040,139 | 8/1991 | Tran | 326/113 |
| 5,162,666 | 11/1992 | Tran . | |
| 5,200,907 | 4/1993 | Tran | 326/113 |
| 5,367,208 | 11/1994 | El Gamal et al. . | |
| 5,677,641 | 10/1997 | Nishio et al. | 326/113 |

OTHER PUBLICATIONS

CMOS3 Cell Library, Addison–Wesley VLSI Systems Series, Edited by Dennis V. Heinbuch, pp. 137–143, Copyright ©1988.

"A 3.8–ns CMOS 16×16–b Multiplier Using Complementary Pass–Transistor Logic," Kazuo Yano et al., IEEE Journal of Solid–State Circuits, vol. 25, No. 2, Apr. 1990, pp. 388–395.

"Pass–transistor logic design," Waleed Al–Assadi et al., Int. J. Electronics, 1991, vol. 70, No. 4, pp. 739–749.

"A 1.5ns 32b CMOS ALU in Double Pass–Transistor Logic," Makoto Suzuki et al., ISSCC 93/Session 5/Microprocessors/Paper TA 5.4, Feb. 25, 1993, pp. 90–91.

"Differential Cascode Voltage Switch with the Pass–Gate (DCVSPG) Logic Tree for High Performance CMOS Digital Systems," F.S. Lai et al., International Symposium on VLSI Technology, Systems, and Applications/Proceedings of Technical Papers, May 12–14, 1993/Taipei, Taiwan, R.O.C., pp. 358–362.

"A High Speed, Low Power, Swing Restored Pass–Transistor Logic Based Multiply and Accumulate Circuit for Multimedia Applications," Akilesh Parameswar et al., IEEE 1994 Custom Integrated Circuits Conference, pp. 278–281.

"Lean Integration: Achieving a Quantum Leap in Performance and Cost of Logic LSIs," Kazuo Yano et al., IEEE 1994 Custom Integrated Circuits Conference, pp. 603–606.

"Pass Transistor Based Gate Array Architecture," Yasuhiko Sasaki et al., 1995 Symposium on VLSI Circuits Digest of Technical Papers, pp. 123–124.

(List continued on next page.)

Primary Examiner—Edward P. Westin
Assistant Examiner—Richard Roseen
Attorney, Agent, or Firm—Oliff & Berridge, PLC

[57] ABSTRACT

A logic circuit combines a plurality of pass-transistor logic trees and a multiple-input logic gate for receiving intermediate logic signals from the respective pass-transistor logic trees, and can express a complex logical operation while decreasing the number of stages in pass-transistor logic trees and improving operation speed. Even a logical operation that cannot be expressed efficiently by a known or conventional pass-transistor logic circuit can be expressed efficiently with performance higher than that of a known CMOS logic circuit. Furthermore, when a static feedthrough current of the multiple-input logic gate is suppressed, power consumption can be reduced. In some embodiments, since circuitry for suppressing a static feedthrough current of the multiple-input logic gate is arranged so that a probability of occurrence of logical collision with a preceding stage will decrease or will be nil, power consumption can further be reduced.

37 Claims, 29 Drawing Sheets

OTHER PUBLICATIONS

"Top–Down Pass–Transistor Logic Design," Kazuo Yano et al., IEEE Journal of Solid–State Circuits, vol. 31, No. 6, Jun. 1996, pp. 792–803.

"Low–Power Logic Styles: CMOS vs CPL," Reto Zimmerman et al., Proceedings of the 22nd European Solid–State Circuits Conference (ESSCIRC '96), Neuchâtel, Switzerland, 17–19 Sep. 1996, pp. 112–115.

LOGIC CIRCUIT UTILIZING PASS TRANSISTORS AND LOGIC GATE

BACKGROUND OF THE INVENTION

1. Field of the invention

The present invention relates to a logic circuit using switching devices, in each of which conduction between an input terminal and output terminal is turned ON or OFF according to a potential at a control terminal, as pass transistors to realize desired logic. In particular, this invention is concerned with a logic circuit capable of realizing complex logic while improving operation speed by decreasing the number of stages of pass transistors required to be connected in series. Furthermore, the present invention relates to a logic circuit capable of realizing logic functions, for which many transistors are needed in conventional pass-transistor logic circuits, using a smaller number of translators, and having characteristics of high operation speed and small power consumption.

2. Description of the Related Art

What is referred to as a "pass-transistor logic circuit" that aims to minimize the number of circuit elements or improve operation speed has been suggested (for example, U.S. Pat. No. 4,541,067). Pass-transistor logic circuits use pass transistors each comprising a switching device. Conduction between an input terminal and output terminal of the switching device is turned ON or OFF according to a potential at a control terminal. Each pass transistor is realized by connecting the switching devices so that whether a logic signal applied to the input terminal is transmitted to the output terminal can be determined with the conducting or nonconducting state of each switching device. In general, a plurality of pass transistors are connected in series and/or parallel to constitute a pass-transistor logic circuit for calculating a desired logical operation. As for the switching devices, MOS transistors, for example, may be used. In this case, the gate, source, and drain of each MOS transistor correspond to the control, input, and output terminals, respectively.

Using this kind of pass-transistor logic circuit, reportedly, the number of required circuit elements can be decreased and operation speed can be improved.

For example, U.S. Pat. No. 4,559,609 has disclosed that when pass transistors (referred to as transmission gates in the patent) are used to constitute a full adder, the number of transistors can be reduced to a smaller number than when only NOR gates formed with XOS transistors are used.

"Lean Integration: Achieving a Quantum Leap in Performance and Cost of Logic LSIs" written by K. Yano et al. (IEEE 1994 Custom Integrated Circuits Conference. p.603–606) has disclosed three kinds of cells Y1 to Y3 to be used for a pass-transistor logic circuit which are shown in FIG. 1. In any of the cells Y1 to Y3, N-channel MOS transistors M1 to M6 are used to constitute a pass-transistor logic circuit. An inverter I is connected to each pass-transistor logic circuit. The cell Y1 is a single-stage pass-transistor logic circuit, the cell Y2 is a pass-transistor logic circuit made by combining single-stage and dual-stage pass-transistor logic circuits, and the cell Y3 is a dual-stage pass-transistor logic circuit. The inverter I is composed of N-channel MOS transistors M1 and M2 and P-channel MOS transistors M3 to M5 as shown in FIG. 2.

As for the foregoing pass-transistor logic circuit, various forms have been proposed. An example of a known pass-transistor logic circuit will be described by taking for example a circuit for calculating the AND of input logic signals A and B (A·B) or the NAND of signals A and B ($\overline{A \cdot B}$). Here, if a logic signal is α, $\overline{\alpha}$ denotes a complementary logic signal of the logic signal α, or a logic signal that is active low.

FIG. 3 shows an example of a pass-transistor logic circuit having circuitry referred to as a cascode voltage switch logic (CVSL). N-channel MOS transistors M1 and M2 are connected in series with their source and drain coupled, and also connected to the drain of a P-channel MOS transistor M5. N-channel MOS transistors M3 and M4 are connected in parallel with their drains coupled, and also connected to the drain of a P-channel MOS transistor M6. The sources of the P-channel MOS transistors M5 and M6 are connected to a first power supply means for supplying a power supply potential (VDD). The sources of the N-channel MOS transistors M2, M3, and M4 are connected to a second power supply means for supplying a reference potential. In this example, a ground (GND) potential is supplied as the reference potential. An input logic signal A is input to the N-channel MOS transistor M1 through its gate, while an input logic signal $\overline{A}$ is input to the N-channel MOS transistor M3 through its gate. An input logic signal B is input to the N-channel MOS transistor M2 through its gate, while an input logic signal $\overline{B}$ is input to the N-channel MOS transistor M4 through its gate. A result of the AND of the signals A and B (A·B) is output through the drain of the P-channel MOS transistor M6. A result of the NAND of the signals A and B ($\overline{A \cdot B}$) is output through the drain of the P-channel MOS transistor M5.

FIG. 4 shows an example of a logic circuit having the circuitry referred to as complementary pass transistor logic (CPL). An input logic signal A is input to an N-channel MOS transistor M1 through its source, while an input logic signal $\overline{A}$ is input to an N-channel MOS transistor M3 through its source. An input logic signal B is input to N-channel MOS transistors M1 and M3 through gates thereof, while an input logic signal $\overline{B}$ is input to N-channel MOS transistors M2 and M4 through gates thereof. The N-channel MOS transistors M1 and M2 are connected in parallel with their drains coupled, and also connected to the drain of the P-channel XOS transistor M5. The N-channel MOS transistors M3 and M4 are connected in parallel with their drains coupled, and also connected to the drain of the P-channel MOS transistor M6. A result of the AND of the signals A and B (A·B) is output through the drain to the P-channel MOS transistor M6 via an inverter I1. A result of the NAND of the signals A·B ($\overline{A \cdot B}$) is output through the drain of the P-channel MOS transistor M5 via an inverter I2.

In the circuit diagrams of FIG. 4 and thereafter, VDD denoting the first power supply means and GND denoting the second power supply means are omitted. In the circuit diagram of FIG. 4 and thereafter, a line terminated with a symbol T shall be connected to the first power supply means, and a line terminated with a symbol of an inverted triangle shall be connected to the second power supply means.

FIG. 5 shows an example of a swing restored pass transistor logic (SRPL). FIG. 6 shows an example of a differential split-level CMOS logic. FIG. 7 shows an example of a double pass-transistor logic (DPL). FIG. 8 shows an example of a differential cascode voltage switch with the pass gate (DCVSPG). In any of FIGS. 5 to 8, input logic signals A and B and $\overline{A}$ and $\overline{B}$ are converted into output logic signals A·B and $\overline{A \cdot B}$.

A full adder configured using only CMOS logic gates shown in FIG. 9 and a full adder using a CPL logic circuit shown in FIG. 10 are compared with each other in terms of the number of transistors required, operation speed, power consumption, and the like.

To begin, as shown in FIG. 9, inverters I1 to I3 are used to produce inverted input logic signals $\overline{A}$ to $\overline{C}$ that are complementary to input logic signals A to C. In FIG. 10, inverted input logic signals are produced in the same manner, though details are not shown.

A signal representing a result of addition, Sum, is produced by N-channel MOS transistors M1 to M10, P-channel MOS transistors M16 to M25, and an inverter I4. A carry, Cout, is produced by N-channel MOS transistors M11 to M15, P-channel MOS transistors M26 to M30, and an inverter I5.

By contrast, in the full adder of a CPL shown in FIG. 10, signals representing results of addition, Sum and $\overline{\text{Sum}}$, are produced by N-channel MOS transistors M1 to M4, and M17 to M20, and inverters I1 and I2. Carries Cout and $\overline{\text{Cout}}$ are produced by N-channel MOS transistors M5 to M16, and inverters I3 and I4.

The number of transistors, speed, power consumption, product of a power and delay time (PD), and product of an energy and delay time (ED) are listed in Table 1 relative to the full adder using only CMOS logic gates shown in FIG. 9, the full adder of a CPL shown in FIG. 10 and the full adders using various kinds of pass-transistor logic circuits of the DPL, DCVSPG, and SRPL types ("A High Speed, Low Power, Swing Restored Pass-Transistor Logic Based Multiply and Accumulate Circuit for Multimedia Applications" written by A. Parameswar et al. Proceedings of IEEE 1994 Custom Integrated Circuit Conference. p.278–281). The design rule is 0.4 micrometers. Note that the PD and ED are indices used to assess performance and that smaller PD and ED values indicate better performance.

TABLE 1

0.4 μm device (full adder)

| | Number of Transistors | Speed (ns) | Power Consumption (mW/100 MHz) | (Relative value) PD | ED |
|---|---|---|---|---|---|
| Ordinary CMOS | 40 | 0.82 | 0.52 | 1.00 | 1.00 |
| CPL | 28 | 0.44 | 0.42 | 0.43 | 0.23 |
| DPL | 48 | 0.63 | 0.58 | 0.86 | 0.66 |
| DCVSPG | 24 | 0.53 | 0.30 | 0.37 | 0.24 |
| SRPL | 28 | 0.48 | 0.19 | 0.21 | 0.13 |

As apparent from Table 1, compared to a full adder configured using CMOS gates alone, when a full adder is configured using a CPL, DCVSPG, or SRPL pass-transistor logic circuit, the number of required transistors is smaller, the speed is higher, and the power consumption is less. As for the PD and ED indices, a full adder using any of the pass-transistor logic circuits is superior to the full adder using CMOS logic gates alone.

However, for realizing various logical operation other than a full adder, generally, it has not been made clear whether a pass-transistor logic circuit is more advantageous than a logic circuit using CMOS logic gates alone (hereinafter referred to simply as a CMOS logic circuit).

Moreover, in known pass-transistor logic circuits, a plurality of pass transistors are connected in series and/or parallel to express desired logical operations. For confining the decay of a signal to be transmitted to a permissible range, the number of pass transistors to be connected in series or parallel is limited. When the number of stages increases, the delay time required until an input logic signal is output varies greatly depending on an input position. This poses the problem that it becomes hard to verify the operating timing of a logic circuit. For avoiding this kind of problem, preferably, the number of stages or trees should be decreased. However, a single-stage pass-transistor logic circuit can handle only three variables (input logic signals) at maximum and can be used merely to realize a logic circuit capable of expressing two product terms each containing two variables. A dual-stage pass-transistor logic circuit can deal with up to seven variables and can express up to four product terms each containing three variables. On the other hand, a triple-stage pass-transistor logic circuit can deal with up to 15 variables and express eight product terms each containing four variables. However, intense restrictions are imposed on such product terms containing a large number of variables. It is hard to efficiently express various logical operations with them.

Moreover, in a pass-transistor logic circuit, desired logical operations are expressed by connecting a plurality of pass transistors in series or parallel. The larger the number of pass transistors to be connected, the larger the series resistance or parallel capacitance becomes. The increase in resistance or capacitance leads to a decrease in rise or fall speed of the output signal. When the rise or fall speed decreases, the operation speed decreases. In addition, power consumption by the logic circuit in the succeeding stage increases, and a noise margin decreases.

Furthermore, it is a problem that the logical amplitude (difference in potential between HIGH and LOW states) of an output logic signal decreases. The decrease in the logical amplitude decreases the noise margin of the logic circuit in the succeeding stage. For example, when an N-channel MOS transistor is used to form a pass transistor, if a signal of a VDD potential is applied to the source thereof acting as an input terminal, the potential of a signal to be applied to the drains acting as an output terminal is lowered substantially to a potential VDD-Vtn-α. Here, Vtn denotes a threshold voltage of the N-channel MOS transistor when a substrate potential is equal to a source potential, and α denotes a change in the threshold voltage caused by a back gate effect. By contrast, when a P-channel MOS transistor is used to form a pass transistor, if a signal of a GND potential is applied to the source thereof, the potential of a signal transmitted to the drain is raised substantially to a potential $|Vtp+\beta|$. Here, Vtp denotes a threshold voltage of the P-channel MOS transistor when a substrate potential is equal to a source potential, and β denotes a change in threshold voltage caused by the back gate effect. This kind of decrease in logical amplitude is inevitable when normally-OFF type switching devices (such as enhancement mode MOS transistors) are used to form pass transistors.

In an effort to solve the problem of a decrease in logical amplitude, it has been proposed to pull up an output of a pass transistor using P-channel MOS transistors, pull it down using N-channel MOS transistors, or pull it up or down using a small inverter. For example, in the pass-transistor logic cells shown in FIG. 1, a pull-up circuit composed of the P-channel MOS transistors M3 and M4 and the N-channel MOS transistor M1 is included in the inverter I shown in FIG. 2. However, when the pull-up or pull-down is thus carried out, the problem arises that load capacitance relative to a logic circuit in a preceding stage becomes larger, signal delay is extended, and power consumption and chip area increase.

As shown in FIG. 11 taken from "CMOS3 Cell Library" by Heinbuch p.138, it has been proposed to combine an N-channel MOS transistor and P-channel MOS transistor to form each pass transistor. This combination is often called a pass gate or transmission gate. In this circuit, a P-channel MOS transistor drives the potential at an output terminal to VDD. While, an N-channel MOS transistor drives the potential at the output terminal to GND potential. Signal transmission can therefore be achieved without a decrease in logical amplitude. However, since the driving capacities of the N-channel MOS transistor and P-channel MOS transistor must be retained at a satisfactory level, the gate width of the P-channel MOS transistor is made generally about the gate width as the gate width of the N-channel MOS transistor. The area of a semiconductor chip needed to manufacture a semiconductor integrated circuit made by combining required logic circuits to realize a desired function becomes much larger than that of a semiconductor chip needed to manufacture a semiconductor integrated circuit using N-channel MOS transistors to form pass transistors. In FIG. 11, numerical values written in parentheses after the reference number of each transistor represent gate length and gate width.

SUMMARY OF THE INVENTION

The present invention attempts to solve the foregoing and other problems encountered in the prior art. An object of the present invention is to provide a logic circuit capable of decreasing the number of transistors, improving operation speed, and reducing power consumption more than a known pass-transistor logic circuit and CMOS logic circuit. Another object of the present invention is to provide a logic circuit capable of realizing complex logic while improving operation speed by suppressing the number of stages in a logic tree composed of pass transistors. Yet another object of the present invention is to provide a general-purpose logic circuit capable of expressing various logical operations including such operations that known pass-transistor logic circuits cannot express efficiently, using a smaller number of transistors, and having characteristics of high operation speed and small power consumption.

A logic circuit in accordance with the present invention in one aspect comprises:

at least two pass transistor logic trees each comprising at least two pass transistors and having at least two input nodes for receiving input logic signals and an intermediate output node for providing an intermediate logic signal;

a multiple-input complementary logic gate having at least two intermediate input nodes each for receiving the intermediate logic signal from corresponding one of the at least two pass-transistor logic trees, and an output node for providing an output logic signal; and a suppressor of a static feedthrough current of the multiple-input complementary logic gate.

A pass transistor is a unit for performing a desired logical operation, and employs a switching device in which conduction between an input terminal and output terminal is turned ON or OFF according to the potential at a control terminal thereof. When the switching device is turned ON, the pass transistor transmits a logic signal applied to an input terminal thereof through an output terminal thereof. In other words, when the input logic signal is HIGH, a HIGH signal is output. When the input logic signal is LOW, a LOW signal is output. By contrast, when the switching device is turned OFF, a logic signal applied to the input terminal of the pass transistor is not transmitted to the output terminal thereof. In other words, the output terminal is floated irrespective of the input logic signal. A MOS transistor is, typically, used as each switching device. The present invention however is not limited to this implementation or mode. For example, a junction field-effect transistor (JFET) can be used. Any switching device that is developed in the future will be able to be employed as well. However, preferably, a normally-OFF type switching device is used because of the ease of applying an output logic signal of a preceding stage as an input logic signal to a control terminal thereof, without modification.

A pass-transistor logic tree is defined as a circuit having two or more pass transistors connected in series and/or parallel, and outputting a result of a logical operation based on input logic signals received through two or more input nodes as an intermediate logic signal through an intermediate output node. Typically, output terminals of two switching devices are coupled, thus forming an intermediate output node.

When pass transistors are connected in series, the output terminal of the pass transistor in a preceding stage is connected to the input terminal of the pass transistor in the next stage. When pass transistors are connected in parallel, the output terminals of the pass transistors are coupled. The control terminals and the input terminals which are not connected to the output terminals of the other pass transistors can be used as input nodes. At least two of the input nodes are used for receiving input logic signals from, for example, logic circuits in preceding stages or I/O circuits. The other input nodes receive logic signals having fixed logic states.

A multiple-input logic gate has a structure in which one switching device or a plurality of switching devices are connected in parallel and/or series between a first power supply means and an output node, and between a second power supply means and the output node. According to a result of a logical operation based on logic signals applied to intermediate input nodes, the output node is connected to either the first power supply means or second power supply means by means of the switching devices. The potential at the output node is thus determined. The first power supply means supplies a power supply potential, while the second power supply means supplies a reference potential. The reference potential is typically a ground potential. The present invention, however, is not limited to this implementation or mode. Depending on the intended use of the logic circuit, a potential different from the ground potential can be supplied as the reference potential. The power supply potential is typically a positive potential relative to the reference potential. The present invention, however again, is not limited to this Implementation or mode. Depending on the intended use of the logic circuit or the characteristics of switching devices employed, it is possible to use a negative potential relative to the reference potential.

The multiple-input logic gate in accordance with the present invention in one aspect includes a plurality of intermediate input nodes used to receive intermediate logic signals from a plurality of pass-transistor logic trees.

As mentioned above, the logic circuit of the present invention has a pass-transistor logic circuit (pass-transistor logic trees) in a preceding stage and has a multiple-input logic gate to receive the outputs (intermediate logic signals) of the pass-transistor logic circuit. In other words, the logic circuit of the present invention is characterized by a composite configuration consisting of a pass-transistor logic circuit and a coupled multiple-input logic gate.

The inventors have recognized a problem that the number of required switching devices in conventional pass-transistor logic circuits can become larger than that of ordinary CMOS logic circuits, depending on the logical operation to be realized. By contrast, in a logic circuit in accordance with the present invention, since pass-transistor logic trees and a multiple-input logic gate are combined, logical operations that are hard for known pass-transistor logic circuits to realize can be realized efficiently. In other words, the logic circuit of the present invention is a superb general-purpose logic circuit that is not restricted in terms of kinds of logical operations to be expressed. Moreover, the inclusion of the multiple-input logic gate facilitates improvement of a rise or fall speed of the output logic signal and permits maintenance of a logical amplitude. When the output signal is received as an input signal by a logic circuit in a succeeding stage, the time required for the signal to reach a logical threshold voltage is shortened. Operation speed can therefore be increased, and power consumption is reduced.

Further, since the logical amplitude of the output logic signal is maintained, a noise margin is maintained in a sufficient level.

The multiple-input logic gate in accordance with the present invention is preferably a complementary logic gate. In a complementary logic gate, opposite conduction type switching devices are used. The first conduction type switching devices are connected in series and/or parallel between the first power supply means and an output node. The second conduction type switching devices are connected in series and/or parallel between the second power supply means and output node. Characteristically, when the logic state of the output logic signal is either HIGH or LOW, either of the conduction type switching devices is OFF, and a static feedthrough current flowing from the first power supply means into the second power supply means is small. "Static feedthrough current" means a feedthrough current flowing when the logic state of the output logic signal is not changing.

A CMOS logic gate made by combining N-channel MOS transistors and P-channel MOS transistors is typically used as the complementary logic gate. However, the present invention is not limited to this implementation or mode. Alternatively, for example, a multiple-input bipolar complementary metal oxide semiconductor (Bi-CMOS) logic gate of which driving capacity relative to a capacitive load is improved by combining a CMOS logic gate and bipolar transistors, can be used. A multiple-input complementary logic gate of any form to be developed in the future can also be used. Using this kind of multiple-input complementary logic gate, a static feedthrough current can be suppressed and power consumption reduced. A logical operation performed by the multiple-input complementary logic gate is not limited to any particular function. Typically, logical operations such as NAND, NOR, AND, and OR operations are carried out.

The present invention is therefore in part characterized by the employment of a suppressor of a static feedthrough current of the multiple-input complementary logic gate.

The inventor has recognized that the coupling between pass transistor logic trees and a multiple-input complementary logic gate facilitates the increase of a static feedthrough current flowing into the complementary logic gate. This is attributable to a decrease in the logical amplitude of an intermediate logic signal of each pass transistor logic tree. Consequently, power consumption increases.

As a solution to the foregoing problem, in one aspect of the present invention, the suppressor of static feedthrough current comprises means for restoring potentials of the intermediate output nodes of the pass transistor logic trees.

The means for restoring restores the potentials at the intermediate output nodes according to proper timing, and thus suppresses a static feedthrough current of the multiple-input complementary logic gate. For example, if the static feedthrough current increases because a signal of the power supply potential decreases while passing through each pass-transistor logic tree, the potentials at the intermediate output nodes are restored to approach or reach the power supply potential. If the static feedthrough current increases because a signal of the reference potential rises while passing, the potentials are restored to approach or reach the reference potential. However, it is not mandatory to restore the potentials to the power supply potential or reference potential. If the potentials should only be restored to a potential exerting a required static feedthrough current suppression effect, it would be sufficient.

This means for restoring can be realized by employing in combination a method adopted for compensating for a decrease in logical amplitude in a known pass transistor logic circuit. For example, a circuit employed in the known pass transistor logic circuit shown in FIGS. 1 and 2 may be used to pull up the potential at an intermediate output node of each pass transistor logic tree. However, the inventors have recognized that the mere employment of the method poses a problem that current consumption increases, because of logical collision between the pull-up circuit and a logic circuit in the preceding stage.

Logical collision occurs when two or more switching devices simultaneously attempt to drive the same node to opposite directions.

In the first embodiment of the present invention, means for restoring restores the potentials of the intermediate output nodes of all the pass-transistor logic trees only when logic states of the intermediate output logic signals of all the pass-transistor logic trees are the same. Since the timing for restoration is thus specified, the probability of occurrence of logical collision can be lowered, and power consumption can be reduced.

In the first embodiment of the present invention, the means for restoring restores the potentials of the intermediate output nodes of all the pass-transistor logic trees in response to the output logic signal of the multiple-input complementary logic gate. In particular, N-channel MOS transistors may be used to form pass transistors forming pass-transistor logic trees. A multiple-input CMOS NAND logic gate may be used as the multiple-input complementary logic gate. P-channel MOS transistors to be turned ON or OFF in response to an output signal of the multiple-input NAND logic gate are thus installed in one-to-one correspondence to the plurality of pass-transistor logic trees. The P-channel MOS transistors pull up the outputs of the pass-transistor logic trees. The static feedthrough current of the multiple-input CMOS logic gate can therefore be suppressed. The benefits of lowering the probability of the occurrence of logical collision, and reducing power consumption, can be realized.

In another embodiment of the present invention, each of the pass transistors comprises a switching device having a first conduction type and a first driving capacity and input, output and control terminals; and means for restoring comprises auxiliary switching devices each provided for each of the switching devices, each of the auxiliary switching devices having a second conduction type and a second driving capacity which is smaller than the first driving capacity;

wherein each of the auxiliary switching devices has an input terminal connected to the input terminal of the corresponding switching device, an output terminal connected to the output terminal of the corresponding switching device, and a control terminal for receiving a complementary logic signal of a logic signal received by the control terminal of the corresponding switching device.

Thus, the static feedthrough current of the multiple-input complementary logic gate can be suppressed without an increase in power consumption deriving from logical collision.

More particularly, in embodiments the switching devices are N-channel MOS transistors each having a first W/L ratio, and the auxiliary switching devices are P-channel MOS transistors each having a second W/L ratio which is smaller than the first W/L ratio. Specifically, an N-channel MOS transistor having a first W/L ratio and a P-channel MOS transistor having a second W/L ratio that is smaller than the first W/L ratio are connected in parallel with their sources and drains coupled, thus forming a unit pass transistor. Here, W denotes a nominal gate width and L denotes a nominal gate length.

The unit pass transistor is configured so that the two logic signals P and Q(=$\bar{P}$), which are mutually complementary, are applied to the gates of the N-channel MOS transistor and P-channel MOS transistor, and so that the N-channel MOS transistor and P-channel MOS transistor are turned ON or OFF simultaneously.

The unit pass transistor can transmit both HIGH and LOW logic signals alike, without a decrease in logical amplitude. For example, when transmitting a signal of the reference potential, the N-channel MOS transistor drives the potential at an output terminal of the unit pass transistor substantially to the reference potential. When transmitting a signal of the power supply potential, the N-channel MOS transistor primarily drives the potential at the output terminal substantially to a potential VDD-Vtn-$\alpha$. Thereafter, the P-channel MOS transistor drives the potential at the output terminal substantially to the power supply potential. Here, Vtn denotes a threshold voltage of the N-channel MOS transistor when a substrate potential is equal to a source potential. $\alpha$ denotes a change in the threshold voltage caused by a back gate effect.

In this embodiment, two unit pass transistors of this kind have their output terminals coupled, and the junction is regarded as an intermediate output node of a pass transistor logic tree. A logic signal can therefore be transmitted to the intermediate output node without a decrease in logical amplitude.

The unit pass transistor in accordance with the present invention is characterized in part by the smaller driving capacity of the auxiliary switching device than the driving capacity of the switching device. When MOS transistors are used as the switching device and the auxiliary switching device, the driving capacity can be defined with dimensions of the transistors. Typically, said switching devices Is an N channel MOS transistor having a first W/L ratio, and said auxiliary switching device is a P channel MOS transistor having a second W/L ratio which is smaller than the fist W/L ratio. Since the driving capacity of a P channel MOS transistor is generally about $\frac{1}{3}$ of that of an N channel MOS transistor having the same W/L ratio, the driving capacity of the P channel MOS transistor having a smaller W/L ratio is smaller than about $\frac{1}{3}$ of the driving capacity of the N channel MOS transistor. Preferably, the W/L ratio of a P-channel MOS transistor employed in this kind of unit pass transistor ranges from about $\frac{1}{2}$ of the W/L ratio of an N-channel MOS transistor to about $\frac{1}{10}$ thereof. The ratio of the W/L ratio of the P-channel MOS transistor to that of the N-channel MOS transistor is equivalent to the ratio of the driving capacity of the P-channel MOS transistor to that of the N-channel MOS transistor which ranges from about $\frac{1}{6}$ to $\frac{1}{30}$.

Since the dimension of the P-channel MOS transistor is thus smaller, an increase in area of a semiconductor integrated circuit chip due to the addition of the P-channel MOS transistors as the means for restoring is limited. Moreover, the smaller dimension of the P channel MOS transistors limits the increase in a load capacitance for a logic circuit in the preceding stage. Therefore, the degradation in the operation speed is also limited. Note that, if the threshold voltages of switching devices constituting a multiple-input complementary logic gate are set appropriately in accordance with a supply voltage (=power supply potential —reference potential), the logical threshold voltage of the multiple-input complementary logic gate is lower than the potential VDD-Vth-$\alpha$. Thus, a logic signal can be transmitted by an N-channel MOS transistor alone. Therefore, even if the driving capacity of a P-channel MOS transistor is low, it does not adversely affect the operation speed of a logic circuit in accordance with the present invention.

To suppress a static feedthrough current and to maintain a noise margin, it is required that a P-channel MOS transistor works and the potential at an intermediate output node approaches the power supply potential. However, in an actual operation of a logic circuit, the time during which an intermediate logic signal sent from each pass-transistor logic tree stays in either HIGH or LOW state is generally much longer than the time during which the logic state of the intermediate logic signal thereof is changing. Therefore, even if the driving capacity of a P-channel MOS transistor is low, the effect of suppressing a static feedthrough current and maintaining a sufficient noise margin can be exerted satisfactorily.

In yet another embodiment of the present invention, each of the pass transistors comprises a first conduction type switching device having a first threshold voltage; and said suppressor of static feedthrough current comprises second conduction type switching devices which constitute the multiple-input complementary logic gate, each of the second conduction type switching devices having a second threshold voltage;

wherein an absolute value of the second threshold voltage is higher than an absolute value of the first threshold voltage.

In particular, both the first and second conduction type switching devices in this embodiment are preferably MOS transistors.

Specifically, when a MOS transistor of one of N and P channel types having a first threshold voltage is used as a pass transistor, the absolute value of the threshold voltage of a MOS transistor of the other channel type constituting a multiple-input CMOS logic gate is made higher than the absolute value of the first threshold voltage. A logical threshold voltage of the multiple-input CMOS logic gate therefore deviates from an intermediate value between a power supply potential and reference potential. Even if the logical amplitude of an intermediate output logic signal of each pass transistor logic tree decreases, the static feedthrough current of the multiple-input CMOS logic gate can be suppressed.

For example, when an N-channel MOS transistor having a threshold voltage Vtn is used to form a pass transistor, the absolute value (|vtp|) of the threshold voltage Vtp of an P-channel MOS transistor constituting a multiple-input CMOS logic gate is made higher than a value |Vtn|.

Typically, normally-OFF type (enhancement mode) N-channel MOS transistors and P-channel MOS transistors are used. In this case, the threshold voltage of the N-channel MOS transistors has a positive value, while the threshold voltage of the P-channel MOS transistors has a negative value.

DESCRIPTION OF PREFERRED EMBODIMENTS

Preferred embodiments of the present invention will be described in conjunction with the drawings below.

Figure 12:
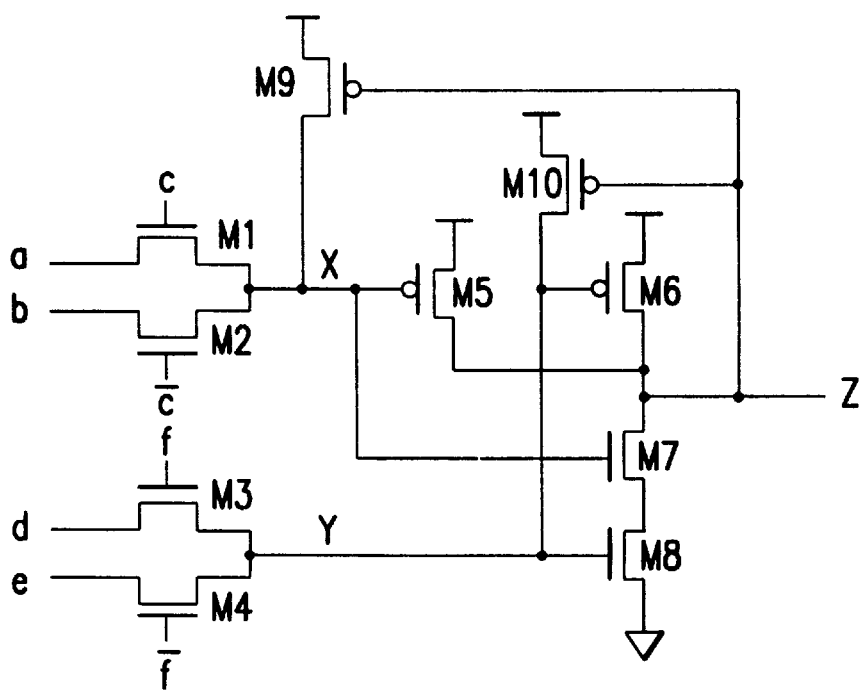
FIG. 12 is a circuit diagram of a logic circuit of the first embodiment of the present invention.

FIG. 12 is a circuit diagram of a logic circuit of a first embodiment of the present invention. This logic circuit includes two single-stage pass transistor logic trees. N-channel MOS transistors and P-channel MOS transistors employed are enhancement mode MOS transistors whose threshold voltages are on a level with those of MOS transistors employed in a conventional CMOS logic circuit. For example, when a supply voltage (−power supply potential−reference potential) is 3.3 V, the threshold voltages of the N-channel XOS transistors and P-channel MOS transistors are typically 0.55 V and −0.55 V, respectively.

N-channel MOS transistors M1 and M2 constitute a first pass transistor logic tree. In the first pass transistor logic tree, the sources and gates of the transistors M1 and M2 act as input nodes and receive logic signals a, b, c, and $\bar{c}$. The drains of the transistors M1 and M2 are coupled, thus forming an intermediate output node. The logic signals a and b can be mutually independent, while the logic signals c and $\bar{c}$ are complementary. Specifically, when one of the signals c and $\bar{c}$ is HIGH, the other signal is LOW. One of the pass transistors M1 and M2 is therefore always ON, thereby preventing floating of the intermediate output node. Though not shown in FIG. 12, it is preferable that the pass-transistor logic tree includes an inverter to produce the signal $\bar{c}$ from the signal c, or vice versa. The logic signals a, b, c and $\bar{c}$ may be input logic signals received from, for example, logic circuits in preceding stages or I/O circuits. Some or all of the input nodes may receive the input logic signals after the signals are inverted by inverters. Typically, the input logic signals are variable logic signals whose logic states vary with time. However, at least some of the input nodes may receive fixed logic signals whose logic states are fixed. For example, when the input nodes are connected to one of the first and the second power supply means, signals whose voltage levels are fixed to the power supply potential or reference potential are received.

A logical operation given as an expression below is calculated using the logic signals, and then an intermediate logic signal X is applied to the intermediate output node.

$$X = a \cdot c + b \cdot \bar{c} \tag{1}$$

where · means AND, and + means OR. The same applies to the following description. As can be seen from the expression (1), if the signal c and one of the signals a and b are the input logic signals, and if the signal $\bar{c}$ is produced by inverting the input logic signal c, the pass-transistor logic tree calculates a logical operation including a product term containing two input logic signals.

A second pass-transistor logic tree is composed of N-channel MOS transistors M3 and M4. The pass-transistor logic tree receives logic signals d to f through Input nodes thereof, calculates a logical operation expressed below, and outputs an intermediate logic signal Y through an intermediate output node thereof.

$$Y = d \cdot f + e \cdot \bar{f} \tag{2}$$

A dual-input CMOS NAND gate is used as a multiple-input logic gate. The dual-input CMOS NAND logic gate has two P-channel MOS transistors M5 and M6 connected in parallel with each other between the first power supply means for supplying a VDD potential and an output node. Two N-channel MOS transistors M7 and M8 are connected in series between the second power supply means for supplying a GND potential and the output node. The gates of the transistors M5 and M7 are coupled, thus forming an intermediate input node through which the intermediate logic signal X produced by the first pass transistor logic tree is received. The gates of the transistors M6 and M8 are coupled, thus forming an intermediate input node through which the intermediate logic signal Y produced by the second pass transistor logic tree is received. The intermediate logic signals X and Y are NANDed according to an expression below, and an output signal Z is output through the output node.

$$Z = \overline{X \cdot Y} = \bar{X} + \bar{Y} \tag{3}$$

Totally, the input logic signals a to f are converted according to an operation expressed below by the logic circuit of this embodiment, whereby the output logic signal Z is produced.

$$\begin{aligned} Z &= \overline{a \cdot c + b \cdot \bar{c}} + \overline{d \cdot f + e \cdot \bar{f}} \\ &= \overline{a \cdot c} + \overline{b \cdot \bar{c}} + \overline{d \cdot f} + \overline{e \cdot \bar{f}} \end{aligned} \tag{4}$$

When the output logic signal is active low, that is, $\bar{Z}$, the following operation is calculated:

$$\begin{aligned} \bar{Z} &= [a \cdot c + b \cdot \bar{c}] \cdot [d \cdot f + e \cdot \bar{f}] \\ &= a \cdot c \cdot d \cdot f + a \cdot c \cdot e \cdot \bar{f} + b \cdot \bar{c} \cdot d \cdot f + b \cdot \bar{c} \cdot e \cdot \bar{f} \end{aligned} \tag{5}$$

As apparent from the expressions (4) and (5), the number of variables dealt with by this embodiment is a maximum of six, that is, the logic signals a to f. If the output is supposed to be active high, up to four product terms each containing two variables can be expressed. If the output is supposed to be active low, up to four product terms each containing four variables can be expressed. P-channel MOS transistors M9 and M10 shown in FIG. 12 are suppressor of a static feedthrough current of the multiple-input complementary logic gate. These P-channel MOS transistors restore the potentials at the intermediate output nodes of the first and second pass transistor logic trees so as to suppress a static feedthrough current of the multiple-input CMOS logic gate.

The necessity of the suppressor of a static feedthrough current of the multiple-input complementary logic gate, and preferred embodiments of the suppressor will be described below.

The inventors have recognized that when the suppressor of a static feedthrough current of the multiple-input complementary logic gate is unused, there arises a problem that the static feedthrough current of a complementary logic gate increases and power consumption increases. In the circuit shown in FIG. 12, discussion will be made of the static feedthrough current flowing from the first power supply means to the second power supply means through the P-channel MOS transistor M5 via the N-channel MOS transistors M7 and M8 or through the P-channel MOS transistor M6 via the N-channel MOS transistors M7 and M8. To begin with, for example, assuming that the N-channel MOS transistor M1 is ON and the logic signal a has 0 V (GND) potential, the intermediate logic signal X falls to around GND potential. However, when the transistor M1 is ON and the input logic signal a has VDD potential, if the P-channel MOS transistor M9 were absent, the intermediate logic signal X would not rise to VDD potential. In other words, assuming that a threshold voltage of the N-channel MOS transistor M1 when a substrate potential is equal to a source potential is Vtn and a change in the threshold voltage caused by a back gate effect is x, even when the potential at the gate of the N-channel MOS transistor M1 becomes equal to VDD potential and the input signal a has VDD potential, a potential difference substantially equal to a value Vtn α occurs between the source of the N-channel MOS transistor M1 and the drain thereof. The potential of the intermediate logic signal X decreases substantially by the value Vtn+α from VDD potential. Here, α is typically about 0.7 V for a transistor in a design rule of 0.8 micrometers when the supply voltage is 5 V. Generally, α changes in proportion with the supply voltage. That is, a device in smaller design rule which operates with a lower supply voltage has smaller α.

As mentioned above, although the intermediate logic signal X is HIGH, the potential at the intermediate output node does not rise beyond a value Vdd-Vtn-α. The P-channel MOS transistor M5 is not therefore turned fully OFF but remains weakly ON. As a result, a static feedthrough current flows from the first power supply means for supplying the VDD potential to the second power supply means for supplying GND potential through the P-channel MOS transistor M5 via the N-channel MOS transistors M7 and M8. Likewise, when the intermediate logic signal Y is HIGH, if the P-channel MOS transistor M10 were absent, the static feedthrough current would flow through the F-channel MOS transistor M6 via the N-channel MOS transistors M7 and M8.

When the static feedthrough current thus flows, power consumption increases in a conventional CMOS logic circuit, a feedthrough current flows only while the logic state of an output logic signal is changing, the feedthrough current flows. However, when the output logic signal stays in either HIGH or LOW state, the feedthrough current does not flow substantially. In other words, only a small current not inviting a significant increase in power consumption flows. Unless a suppressor of a static feedthrough current were included, a logic circuit of this embodiment would be more disadvantageous than the known CMOS logic circuit in terms of power consumption.

At the same time, when the intermediate logic signal is HIGH, a difference between the potential at an intermediate input terminal of a multiple-input logic gate and a logical threshold voltage (normally set to an intermediate value between the power supply potential and reference potential) becomes smaller. A probability of occurrence of logic state reversal due to a noise becomes higher. In other words, a noise margin decreases.

One method of realizing a suppressor of a static feedthrough current is to employ means for restoring the potential at intermediate output nodes. Conceivably, for example, a known pull-up circuit used in the pass-transistor logic circuits shown in FIG. 2 may be used to restore the potential at an intermediate output node toward VDD potential. The potential at the intermediate output node then approaches VDD potential. The P-channel MOS transistor M5 or M6 approaches a fully-OFF state. The static feedthrough current is confined to a value not causing a problem in practice. At the same time, the noise margin is maintained in a sufficient level. However, the inventors have recognized that this method may solve the problem of the static feedthrough current but cause power consumption to increase because of logical collision with a logic circuit in the preceding stage. Logical collision occurs when two or more switching devices simultaneously attempt to drive the same node to opposite directions.

Figure 1:
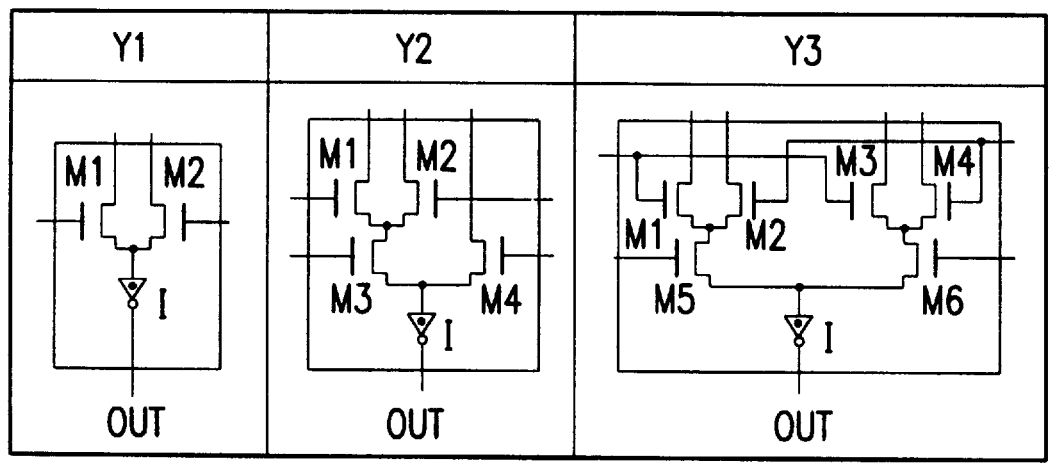
FIGS. 1 and 2 are circuit diagrams of cells in a conventional pass-transistor logic circuit.
Figure 2:
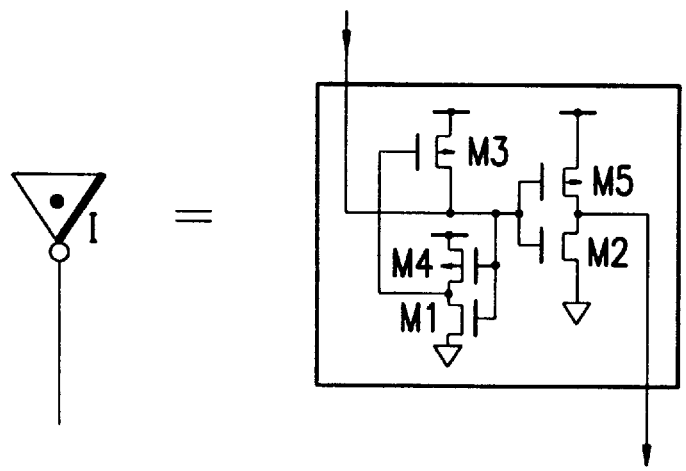
Figure 3:
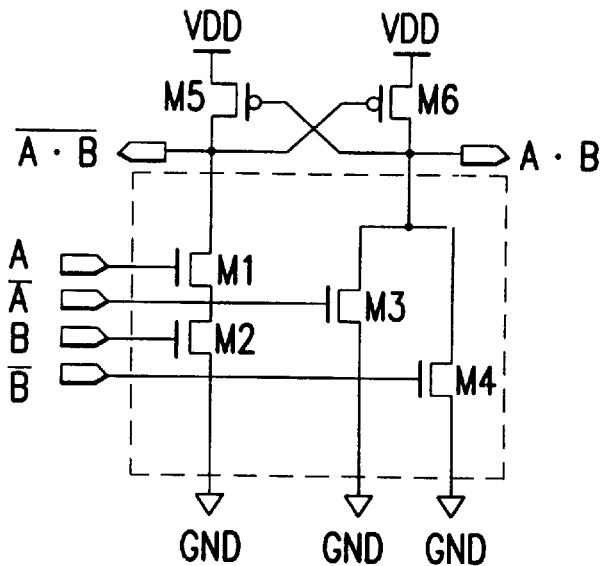
FIGS. 3 to 8 are circuit diagrams of various kinds of conventional pass transistor circuits.
Figure 4:
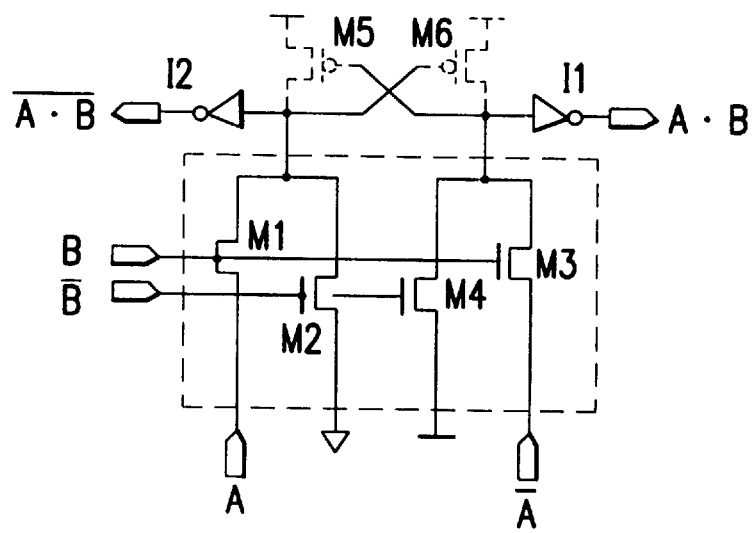
Figure 5:
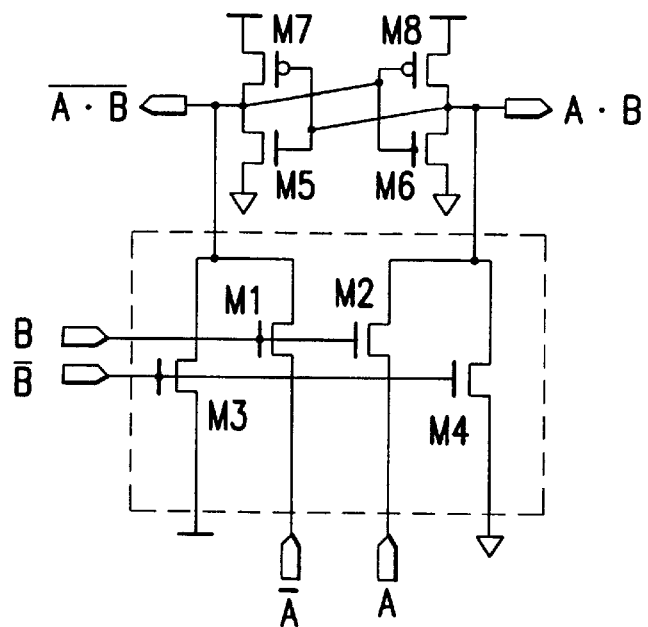
Figure 6:
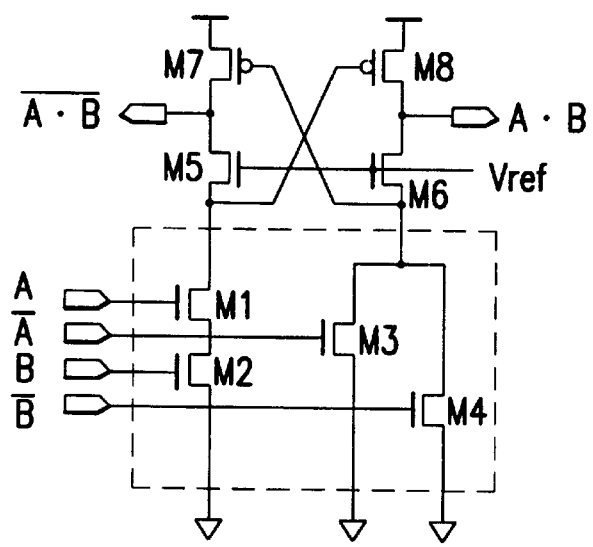
Figure 7:
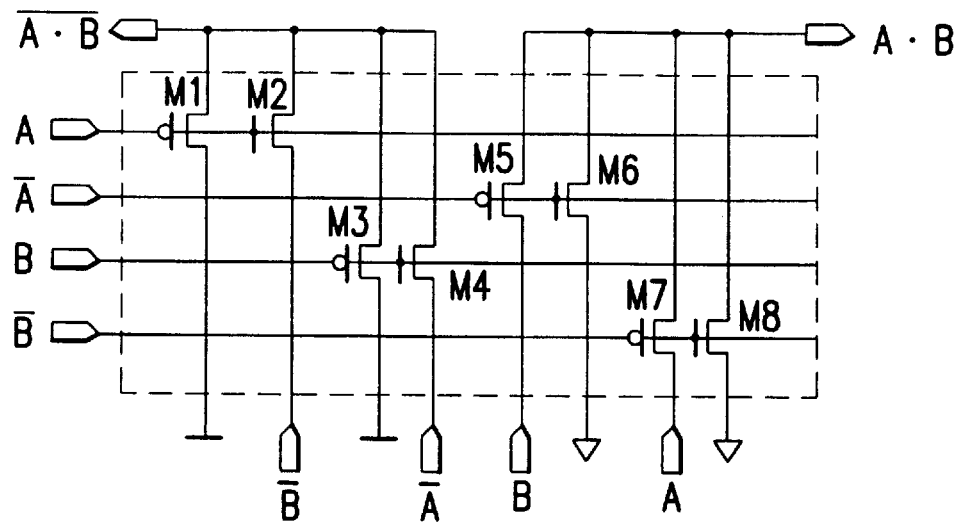
Figure 13:
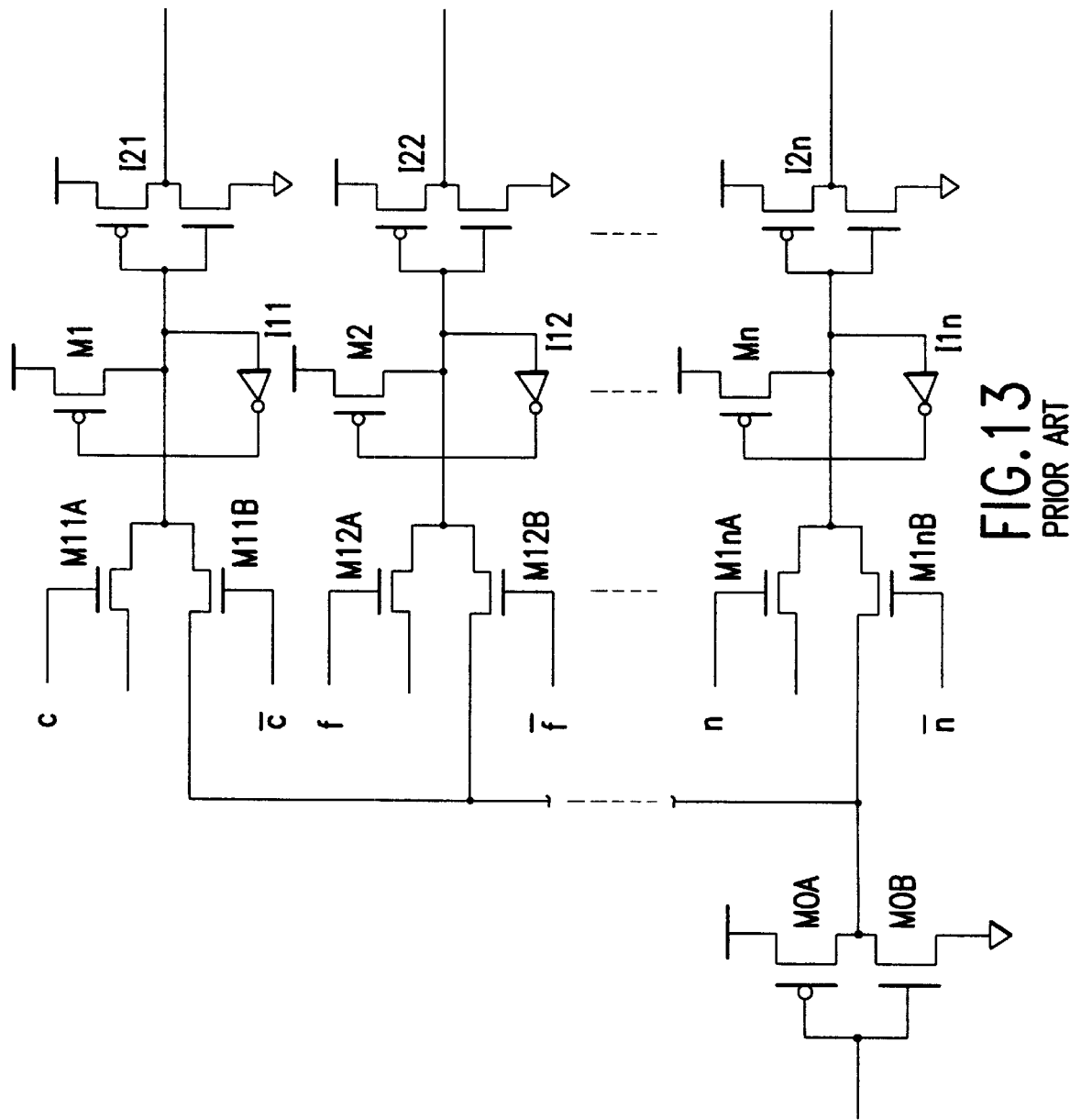
FIG. 13 is a circuit diagram of an example of a known pass-transistor logic circuit made by combining the cells shown in FIG. 1.

FIG. 13 shows an example of a known pass-transistor logic circuit using the cells shown in is FIGS. 1 and 2. Here, n Y1 cells are connected in parallel to an output node of a logic circuit in a preceding stage having an Inverter composed of a P-channel MOS transistor M0A and N-channel MOS transistor M0B. Each pair of inverters I11 to I1n, and transistors Ml, to Mn corresponds to the pull-up circuit composed of the transistors M1, M3, and M4 shown in FIG. 2.

In this circuit, assume that an input logic signal c to be applied to the gate of a pass transistor M11A is LOW, an input logic signal $\bar{c}$ to be applied to the gate of a transistor M11B is HIGH, and the inverter composed of the transistors M0A and M0B outputs a HIGH signal. At this time, a logic signal transmitted to the input node of an inverter I21 through the transistor M11B is detected by the inverter I11 of a pull-up circuit. The potential at the gate of the P-channel MOS transistor M1 becomes substantially equal to GND potential, and the transistor M1 is turned ON. The potential at the input node of the inverter I21 is pulled up toward VDD potential. Now, assume that after the state is set, the output of the inverter composed of the MOS transistors M0A and M0B Is driven low. In this case, the inverter composed of the MOS transistors M0A and M0B is required to pull down the potential at the input node of the inverter I21, which has been pulled up by the pull-up circuit, toward GND potential against the P-channel MOS transistor M1 of the pull-up circuit. In short, logical collision occurs between the pull-up circuit and the logic circuit in the preceding stage.

The logical collision causes a feedthrough current to flow from the transistor M1 through the transistors M11B and M0B, and power consumption to increase.

Moreover, a load for the logic circuit in the preceding stage gets larger, and therefore the time required for driving the load gets longer. At worst, if the potentials at the input nodes of all inverters I22 to I2n have been pulled up, a feedthrough current routed from the transistor M2 through the transistors M12B and M0B, and all the other feedthrough currents routed from the transistors Mn through the transistors M1nB and M0B would flow, all at the same time. In this case, not only does power consumption increase greatly but also the signal is overwhelmed by the load and not transmitted. For solving this kind of problem, conceivably, the driving capacity of the inverter in the logic circuit in the preceding circuit may be increased. However, this method brings about the problem of increased chip area and increased power consumption.

Figure 8:
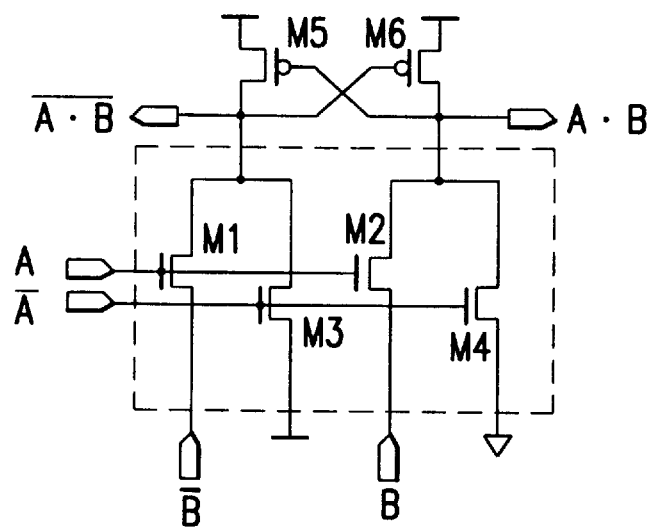
Figure 9:
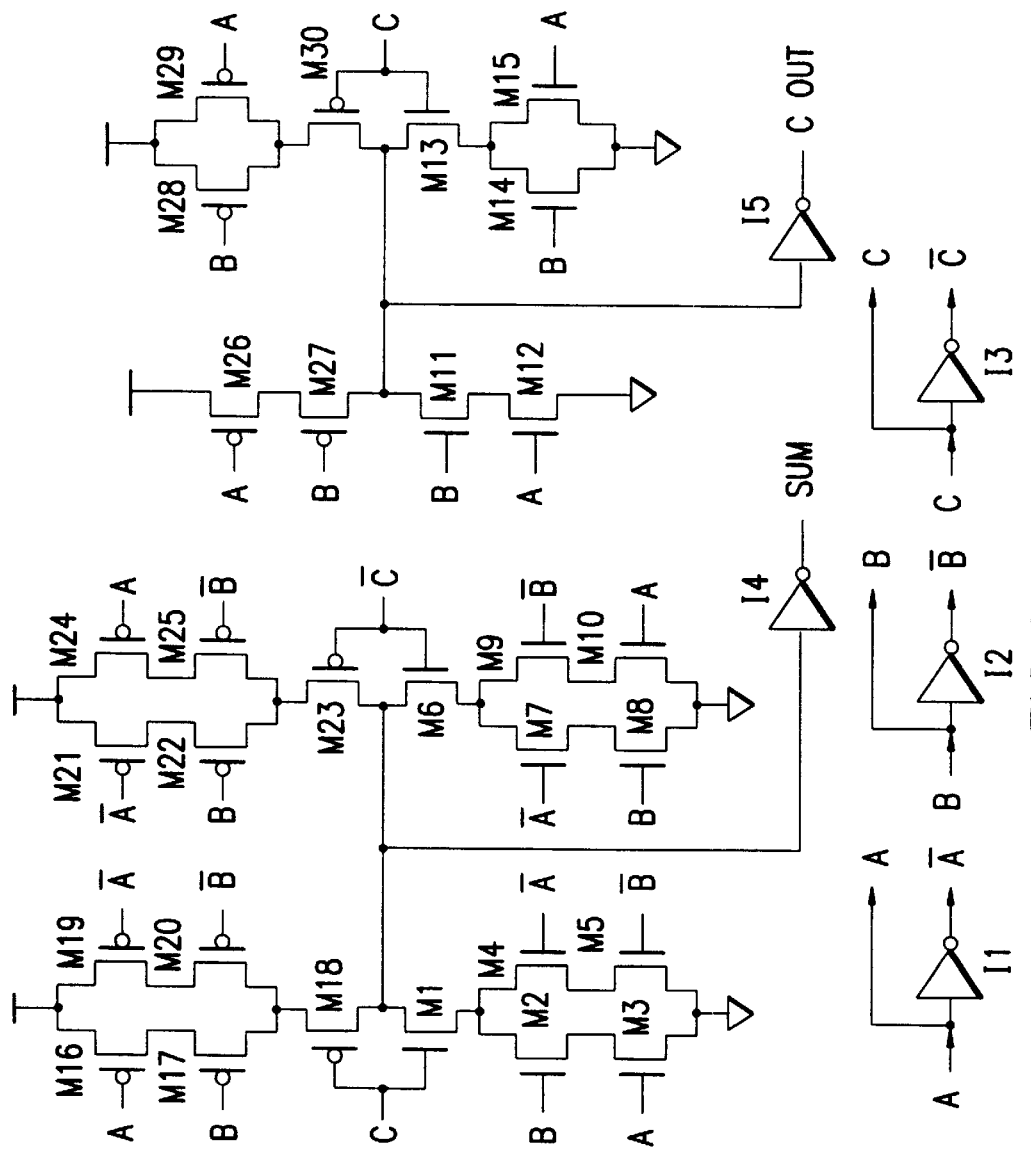
FIG. 9 is a circuit diagram of an example of a full adder using CMOS logic gates alone.
Figure 10:
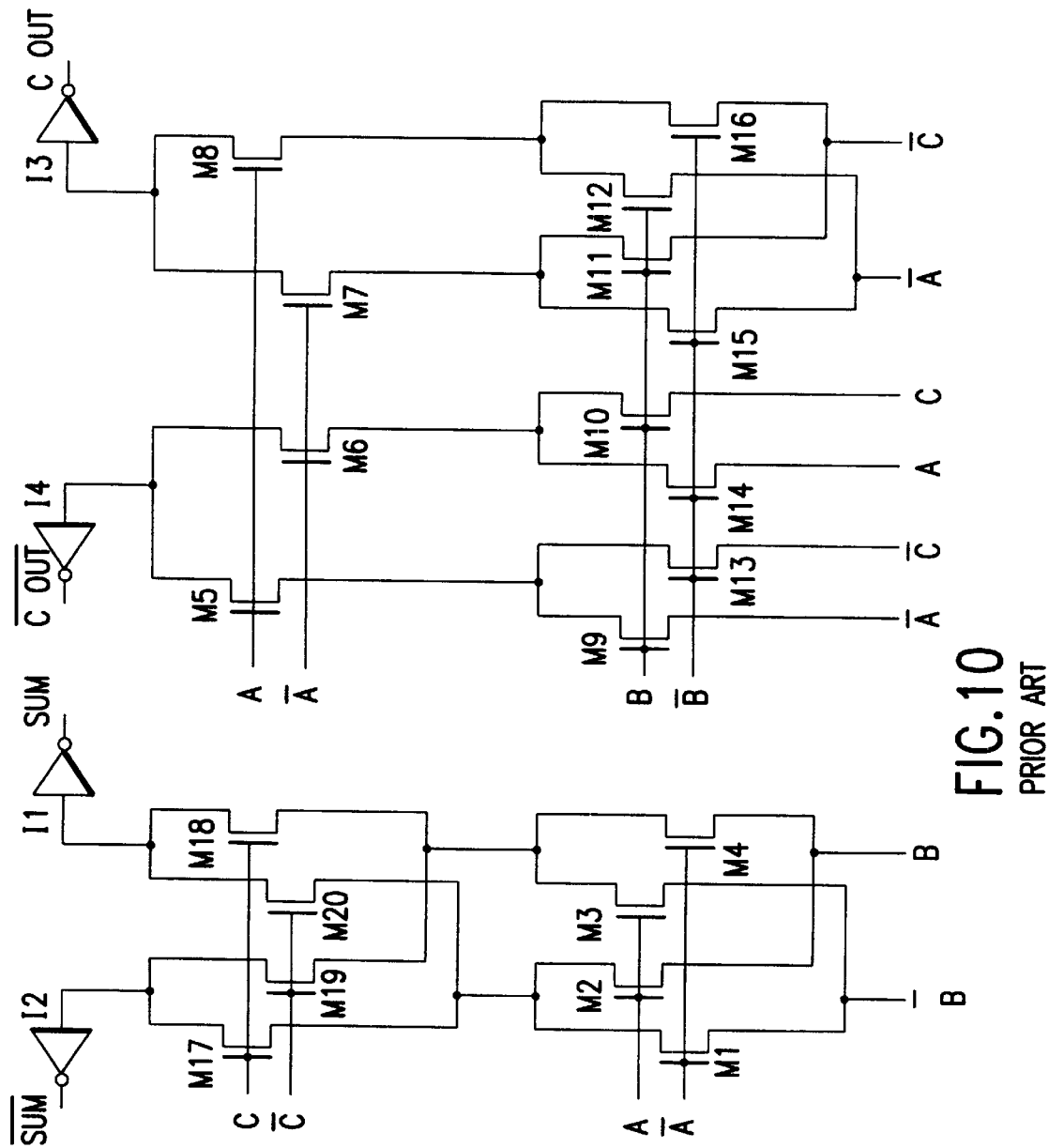
FIG. 10 is a circuit diagram of an example of a full adder using a conventional pass-transistor logic circuit.
Figure 11:
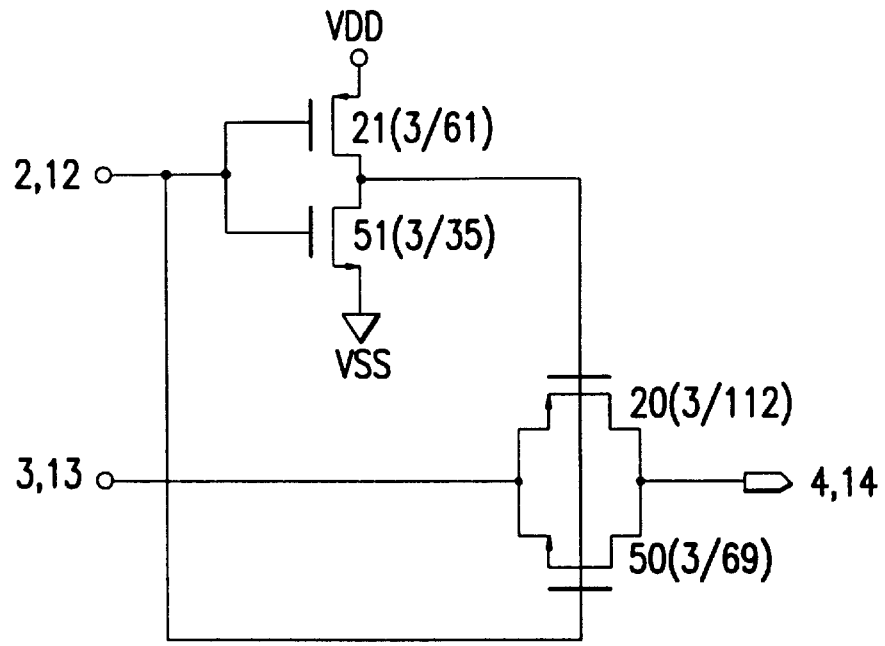
FIG. 11 is a circuit diagram of a conventional transmission gate.

Even in a logic circuit of the present invention made by combining a plurality of pass-transistor logic trees and a multiple-input complementary logic gate, if a pull-up circuit for detecting the potential at an associated node like, for example, the one shown in FIG. 8 is connected to an intermediate output node of each pass-transistor logic tree, a static feedthrough current of a multiple-input CMOS logic gate can be suppressed. After the potential at the intermediate output node is driven to around a value VDD-Vtn-α, by an N-channel MOS transistor used to form a pass transistor, the potential is further driven toward the VDD potential by the pull-up circuit. However, even in this case, similar to the case shown in FIG. 13, apparently, the problem of an increased power consumption deriving from logical collision occurs. The inventors have recognized that as long as a pull-up circuit or pull-down circuit is employed, it is inevitable to have the problem of logical collision. However, it is possible to lower a probability of occurrence of logical collision by modifying the circuitry.

In this embodiment shown in FIG. 12, a pull-up circuit composed of the P-channel MOS transistors M1 and M10 is included. The pull-up circuit pulls up the potentials at the intermediate output nodes of the first and second pass transistor logic trees toward VDD potential in response to an output logic signal Z of the multiple-input CMOS NAND gate. More particularly, only when the signal Z is LOW, that is, only when both the intermediate logic signals provided by the first and second pass-transistor logic trees are HIGH, the potentials at both the intermediate output nodes are pulled up. Compared with a known circuit like the pull-up circuit shown in FIG. 2 for detecting and pulling up the potential at the corresponding node, the pull-up circuit in this embodiment halves a probability of the potential at each intermediate output node being pulled up. A probability of occurrence of logical collision is also halved. The probability gets lower as the number of pass-transistor logic trees gets larger and the number of input nodes of a multiple-input logical gate gets larger accordingly. For example, when the number of pass-transistor logic trees is three, the probability becomes a half of that attained when the number of pass-transistor logic trees is two.

Pull-up (or pull-down) is performed in response to an output logic signal of a multiple-input logic gate. The multiple-input logic gate must therefore have one of a specified logical operations so that the potentials at the intermediate output nodes of all pass-transistor logic trees are pulled up (or pulled down) at proper timing. For example, as shown in FIG. 12, an output logic signal of a multiple-input NAND gate can be fed back directly to the gages of the pull-up P-channel MOS transistors. Similarly, an output logic signal of a multiple-input AND gate may he fed back to the gates of the pull-up P-channel MOS transistors via an inverter. For pulling down, for example, an output logic signal of a multiple-input NOR gate or an output logic signal of a multiple-input OR gate may be fed back directly or via an inverter to the gates of pull-down N-channel MOS transistors.

In this embodiment, the dimension (W/L ratio) of MOS transistors serving as pull-up transistors is smaller than that of MOS transistors used to form pass transistors. For reducing a load for a CMOS NAND gate, and for reducing a load for a logic circuit in the preceding stage when logical collision occurs, it is preferable to reduce the dimension of pull-up MOS transistor. Further, a smaller dimension of pull-up transistors reduces chip area of a semiconductor integrated circuit including necessary logic circuits. Note that if the threshold voltages of N-channel and P-channel MOS transistors constituting a multiple-input CMOS logic gate are set appropriately in accordance with the supply voltage, the logical threshold voltage of a multiple-input CMOS logic gate is usually lower than a potential VDD-Vtn-α. Thus, logic signals can be transmitted by N-channel MOS transistors alone. Therefore, even if the driving capacity of P-channel pull-up MOS transistors is low, it will not adversely affect the operation speed of a logic circuit in accordance with the present invention.

For suppressing static feedthrough current and for maintaining a sufficient noise margin, the pull-up circuit must work so that the potentials at the intermediate output nodes approach the power supply potential. In actual operation of a logic circuit, however, the time during which each intermediate logic signal stays in either HIGH or LOW state is generally much longer than the time during which the logic state of intermediate output logic signal is changing. Therefore, even if the driving capacity of P-channel pull-up MOS transistors is low, the effect of suppressing a static feedthrough current and maintaining a sufficient noise margin can be exerted satisfactorily.

A simulation has conducted for transistors in 0.5 micrometers design rule. It has been demonstrated that, taking factors including operation speed and power consumption into consideration, a performance of a logic circuit will be maximized at a W/L ratio of P-channel pull-up MOS transistors of about ⅓ of that of N-channel MOS transistors used to form pass transistors.

In the present invention, the potentials at the intermediate output nodes need not always be pulled up to a power supply potential. As long as even a potential lower than the power supply potential makes it possible to suppress a static feedthrough current of a multiple-input complementary logic gate to a value causing no problem in practice, the potential is acceptable. In this case, when a signal having VDD potential is received through an input node of a pass-transistor logic tree, the potential at an intermediate output node is not restored to the potential at the input node. Depending on the threshold voltage of P-channel MOS transistors constituting a multiple-input CMOS logic gate, for suppressing the static feedthrough current sufficiently, it may be desired that the potentials at the intermediate output nodes are pulled up to a potential higher than a power supply potential supplied to the multiple-input CMOS logic gate, or are restored according to any other method.

In the logic circuit shown in FIG. 12, the pull-up circuit works only when the intermediate logic signals provided by all the pass-transistor logic trees are HIGH. That is, even though one of the intermediate logic signals is HIGH, the potential of the corresponding intermediate output node is not pulled up if other one of the intermediate logic signal is LOW. However, such operation of the pull-up circuit does not degrade the effect of suppressing a static feedthrough current and maintaining a sufficient noise margin. Assume that, for example, the intermediate logic signal X is HIGH and the intermediate logic signal Y is LOW, then, the pull-up circuit does not work and potential at a first intermediate input node which receives the signal X stays at a potential around VDD-Vtn-α. In this case, a margin between the logical threshold voltage of the multiple-input logic gate and the potential at the first intermediate input node is decreased. However, even though the fist intermediate input node receives a noise larger than the margin, the logic state of the output node of the multiple-input logic gate will not change, because the N-channel MOS transistor M8 is fully OFF. Similarly, even though the P-channel MOS transistor M5 is weakly ON, a static feedthrough current of the multiple-input logic gate is sufficiently suppressed because the N-channel MOS transistor M8 is fully OFF.

As discussed in the preceding paragraphs, in this embodiment, circuits for pulling up the potentials at intermediate output nodes of pass-transistor logic trees in response to an output logic signal of a multiple-input complementary logic gate are included to suppress a static feedthrough current of the multiple-input CMOS logic circuit and to lower a probability of occurrence of logical collision with a logic circuit in a preceding stage.

By adjusting the threshold voltages of N-channel MOS transistors and P-channel MOS transistors constituting a logic circuit, a static feedthrough current can be suppressed without the use of a pull-up circuit.

For example, in the logic circuit shown in FIG. 12, the absolute value of the threshold voltage Vtp of the P-channel MOS transistors M5 and M6 constituting the CMOS NAND gate is made higher than the absolute value of the threshold voltage Vtn of the N-channel MOS transistors M1 and M4 used to form pass transistors. In this case, when intermediate logic signals are HIGH, the potentials at intermediate output nodes do not rise beyond approximately a potential VDD-Vtn-α if the P-channel pull-up transistors M9 and M10 are not used. However, since the absolute value of Vtp is higher than the absolute value of Vtn, a static feedthrough current flowing through the CMOS NAND gate can be suppressed, even if the P-channel MOS pull-up transistors M9 and M10 are unused. In this embodiment, logical collision does not occur. More specifically, if a difference between the values |vtp| and |Vtn| is made equal to or larger than |α|0.2 V, a significant effect of suppressing a static feedthrough current can be exerted. Normally, Vtn has a positive value, while Vtp has a negative value. For example, when the Vtn value is 0.6 V and the α value is 0.7 V, the Vtp value is made equal to or smaller than about −1.3 V.

In the aforesaid description, a logic circuit in which N-channel MOS transistors are used to form pass transistors is taken as an example. However, the present invention may apply to a mode or implementation in which any type of transistors other than N-channel MOS transistors are used to form pass transistors. For example, N-type JFETs may be used or switching devices of any other form to be developed in the future may be used. Moreover, P-channel MOS transistors may be used to form pass transistors in a logic circuit in accordance with the present invention.

When P-channel MOS transistors are used to form pass transistors, preferably, a multiple-input NOR gate is used as a multiple-input complementary logic gate of the present invention in place of a multiple-input NAND gate. In this case, the potentials at intermediate output nodes are preferably pulled down by N-channel MOS transistors. An output logic signal of the NOR gate can be fed back to the gates of the N-channel pull-down transistors.

Figure 14:
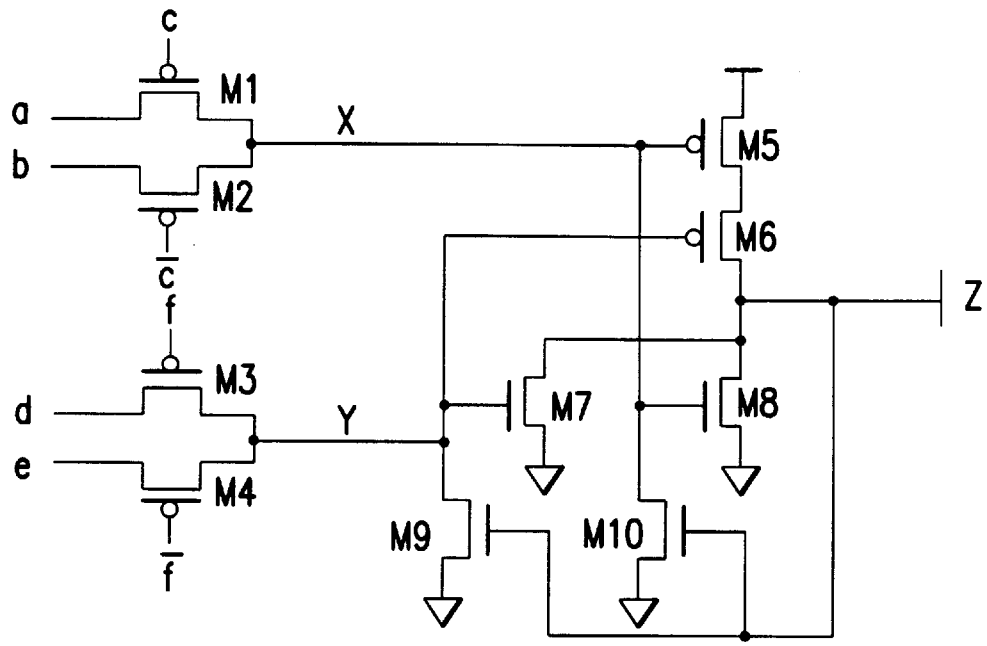
FIG. 14 is a circuit diagram of an example of a logic circuit of the present invention using P-channel MOS transistors as pass transistor.

FIG. 14 is a circuit diagram of an embodiment of the present invention having two single-stage pass-transistor logic trees in which P-channel MOS transistors are used to form pass transistors.

In this embodiment, a first pass-transistor logic tree is composed of P-channel MOS transistors M1 and M2. A second pass-transistor logic tree is composed of P-channel MOS transistors M3 and M4. A dual-input CMOS NOR gate is used as a multiple-input logic gate. In the dual-input CMOS NOR logic gate, two P-channel MOS transistors M5 and M6 are connected in series between the first power supply means for supplying VDD potential and an output node, and two N-channel MOS transistors M7 and M8 are connected in parallel between the second power supply means for supplying GND potential and the output node. The gates of the transistors M5 and M8 are coupled, thus forming an intermediate input node through which an intermediate logic signal X produced by the first pass-transistor logic tree is received. The gates of the transistors M6 and M7 are coupled, thus forming an intermediate input node through which an intermediate logic signal Y produced by the second pass-transistor logic tree is received.

A pull-down circuit formed with an N-channel MOS transistor M10 is connected to an intermediate output node of the first pass-transistor logic tree, and a pull-down circuit formed with an N-channel MOS transistor M9 is connected to an intermediate output node of the second pass-transistor logic tree. The N-channel MOS transistors M9 and M10 serving as the pull-down transistors are turned ON only when an output logic signal Z of the dual-input NOR gate is HIGH, and perform pull-down. Transistors whose dimensions are smaller than P-channel MOS transistors used to form pass transistors are used as the N-channel MOS pull-down transistors M9 and M10.

When P-channel MOS transistors are used to form pass transistors, if the intermediate logic signals X and Y are HIGH, the potentials at the intermediate output nodes rise substantially to the power supply potential. By contrast, if the pull-down circuits were absent, when the intermediate logic signals X and Y are LOW, the potentials at the intermediate output nodes would not fall below approximately a potential $|Vtp+\beta|$. However, since the pull-down circuits are installed, the potentials fall substantially to GND potential. A static feedthrough current of the CMOS logic gate can therefore be suppressed satisfactorily. Here, Vtp denotes a threshold voltage of the transistors M1, M2, M3, and M4 when a substrate potential is equal to a source potential. $\beta$ denotes a change in the threshold voltage caused by a back gate affect.

In the logic circuit shown in FIG. 14, logical operations for providing the intermediate logic signals X and Y and the output logic signal Z are expressed as follows:

$$X = a \cdot \bar{c} + b \cdot c \tag{6}$$

$$Y = d \cdot \bar{f} + e \cdot f \tag{7}$$

$$Z = \overline{X+Y} - = \overline{X \cdot Y} \tag{8}$$

$$Z = \bar{a} \cdot \bar{c} \cdot \bar{d} \cdot \bar{f} + \bar{a} \cdot \bar{c} \cdot \bar{e} \cdot f + \bar{b} \cdot c \cdot \bar{d} \cdot \bar{f} + \bar{b} \cdot c \cdot \bar{e} \cdot f \tag{9}$$

$$\overline{Z} = a \cdot \bar{c} + b \cdot c + d \cdot \bar{f} + e \cdot f \tag{10}$$

Both N-channel MOS transistors and P-channel MOS transistors may be used to form pass transistors and to eventually constitute a pass-transistor logic tree. For example, in the logic circuit shown in FIG. 12, complementary logic signals such as the signals c and $\bar{c}$ must be applied to the gates of N-channel MOS transistors used to form a pass-transistor logic tree. When both an N-channel MOS transistor and P-channel MOS transistor are used to form a pass-transistor logic tree, it becomes unnecessary to apply such complementary logic signals.

Figure 15:
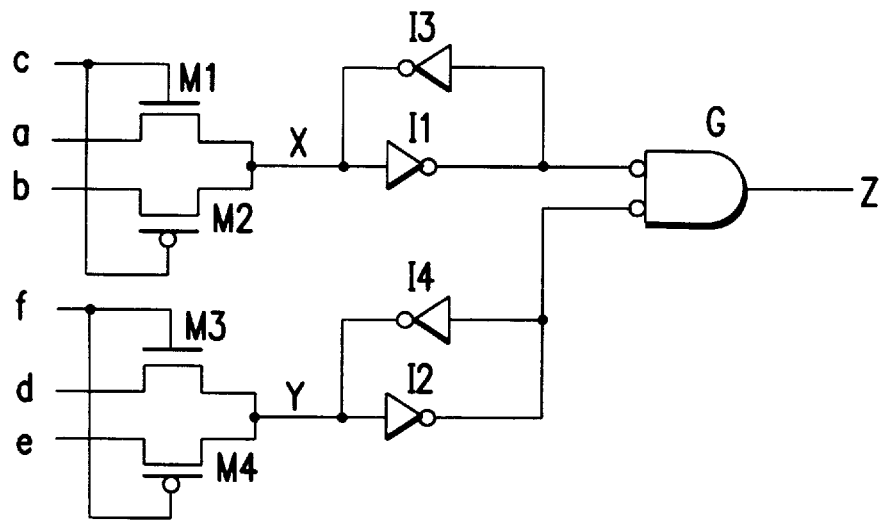
FIG. 15 is a circuit diagram of an example of a logic circuit of the present invention using both N-channel MOS transistors and P-channel MOS transistors as pass transistors.

FIG. 15 is a circuit diagram of an embodiment of a logic circuit of the present invention in which two single-stage pass-transistor logic trees are formed using both N-channel MOS transistors and P-channel MOS transistors to form pass transistors. In this embodiment, input nodes of a dual-input CMOS logic gate G are connected to intermediate output nodes of first and second pass-transistor logic trees via latches each made by combining inverters I1 and I3 and inverters I2 and I4, respectively. The latches each restore a decrease in logical amplitude occurring when a logic signal passes through a pass-transistor logic tree.

In each of the latches, the potential at an input node of one of the inverters is driven to around the power supply potential or reference potential by the other inverter. A static feedthrough current of the multiple-input complementary logic gate can therefore be suppressed, and a static feedthrough current of each inverter can also be suppressed.

However, in the logic circuit of this embodiment, since the inverters are employed, the number of pass steps is larger. By contrast, for example, in the logic circuit of the present invention shown in FIG. 12, the output terminals of the switching devices used to form pass transistors are directly connected to the control terminals of the switching devices constituting the multiple-input logic gate. There is therefore no problem of a larger number of pass steps. From this viewpoint, the logic circuit shown in FIG. 12 is preferred to the one shown in FIG. 15.

What is referred to as the "number of pass steps" is the number of switching devices through which a logic signal input through an input node passes until it is output through an output node. An increase in the number of pass steps invites a decrease in operation speed.

Logical operations for providing the intermediate logic signals X and Y and the output logic signal Z to be calculated by the logic circuit shown in FIG. 15 are expressed as follows:

$$X = a \cdot c + b \cdot \bar{c} \tag{11}$$

$$Y = d \cdot f + e \cdot \bar{f} \tag{12}$$

$$Z = X \cdot Y = \overline{X+Y} \tag{13}$$

$$Z = a \cdot c \cdot d \cdot f + a \cdot c \cdot e \cdot \bar{f} + b \cdot \bar{c} \cdot d \cdot f + b \cdot \bar{c} \cdot e \cdot \bar{f} \tag{14}$$

$$\overline{Z} = \bar{a} \cdot c + \bar{b} \cdot \bar{c} + \bar{d} \cdot f + \bar{e} \cdot \bar{f} \tag{15}$$

Figure 16:
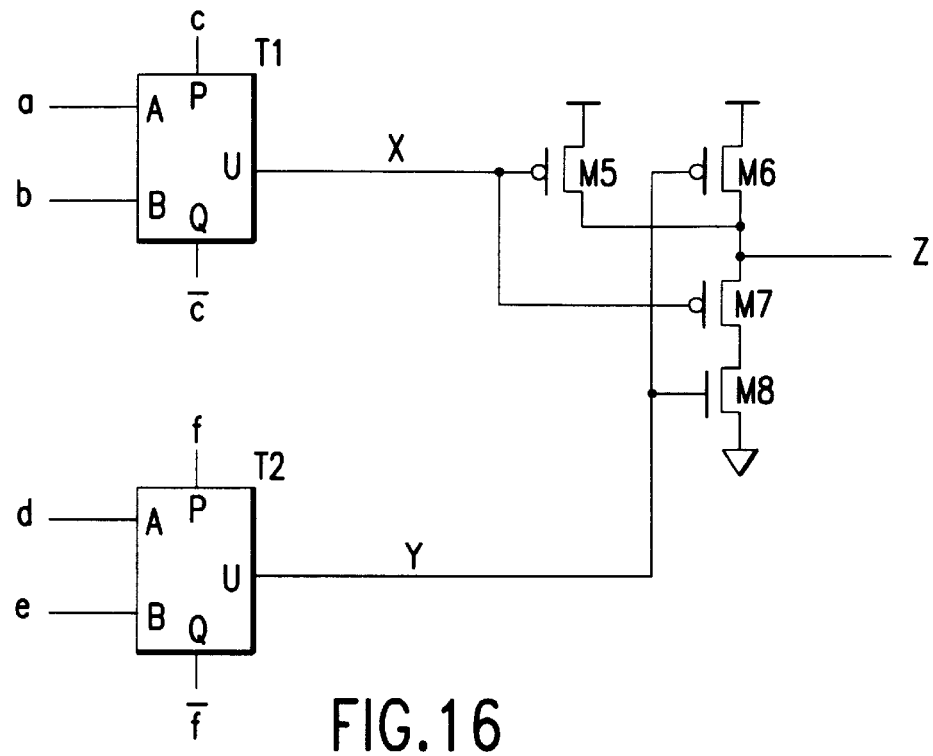
FIG. 16 is a circuit diagram of a logic circuit of the second embodiment of the present invention.

FIG. 16 is a circuit diagram of a logic circuit of the second embodiment of the present invention having two single-stage pass-transistor logic trees.

Each of T1 and T2 in the drawing denotes a circuit (hereinafter, a pair pass transistor element) enclosed in a square drawn with a dot-dash line in FIG. 17. Here, an N-channel MOS transistor M1A and P-channel MOS transistor M1B are connected in parallel with their sources and drains coupled, thus forming a first unit pass transistor. An N-channel MOS transistor M2A and P-channel MOS transistor M2B are connected in parallel with their sources and drains coupled, thus forming a second unit pass transistor. The output terminals (drains) of the first and second unit pass transistors are coupled. A pair pass transistor element T is thus configured. The N-channel MOS transistor and P-channel MOS transistor constituting each unit pass transistor are connected so that they can receive two input signals P and Q, which are mutually complementary, through the gates thereof. The N-channel MOS transistor and P-channel MOS transistor are therefore turned ON or OFF simultaneously. For example, when the transistor M1A is ON, the transistor M1B is turned ON. When the transistor M1A is OFF, the transistor M1B is turned OFF.

The dimension (W/L ratio) of a P-channel MOS transistor used to form each unit pass transistor is smaller than that of an N-channel MOS transistor. For example, a preferable ratio of the W/L ratio of the P-channel MOS transistor to that of the N-channel MOS transistor ranges from about ½ to ¹⁄₁₀, or more particularly, is about ⅓ or less than about ⅕.

In the logic circuit shown in FIG. 16, pair pass transistor element T1 forms a first pass transistor logic tree. A source of the first unit pass transistor composed of the transistors M1A and M1B serves as an input node through which a logic signal a is received. A source of the second unit pass transistor composed of the transistors M2A and M2B serves as an input node through which a logic signal b is received.

The gates of the transistors M1A and M2B are coupled, thus forming an input node through which a logic signal c is received. The gates of the transistors M2A and M1B are coupled, thus forming an input node through which a logic signal $\bar{c}$ is received. The drains of the first and second unit pass transistors are coupled, thus forming an intermediate output node through which an intermediate logic signal X is output.

Likewise, a pair pass transistor element T2 forms a second pass-transistor logic tree. A dual-input CMOS NAND gate for receiving intermediate logic signals from the two pass-transistor logic trees is connected to the logic trees, whereby a logic circuit for expressing the same logic as the circuit shown in FIG. 12 is configured.

Figure 17:
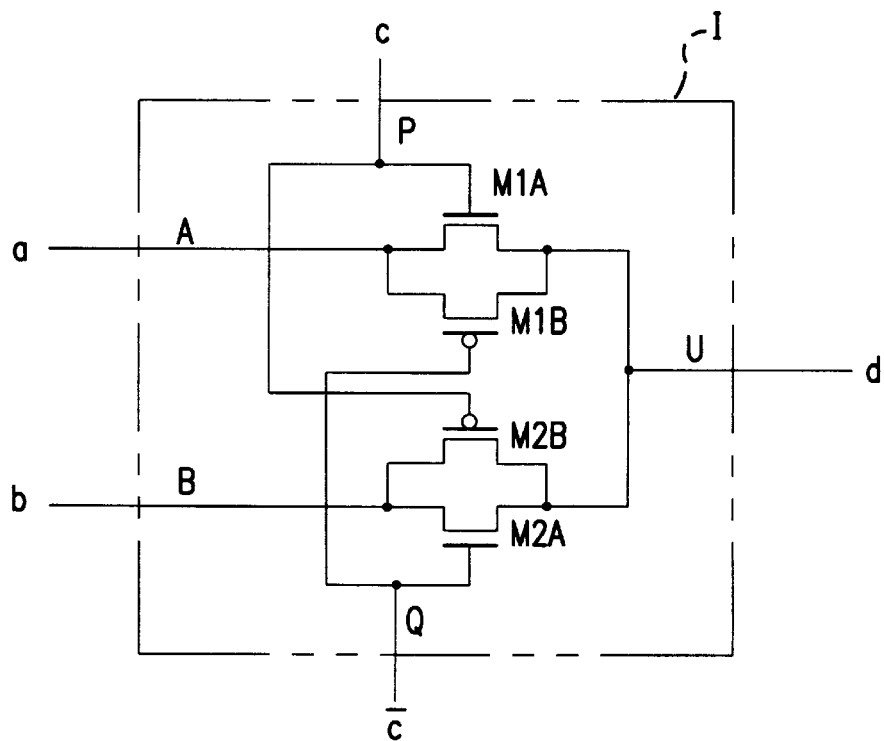
FIG. 17 is a circuit diagram of a paired pass transistor element used in the circuit shown in FIG. 16.

Unit pass transistors constituting each pair pass transistor element shown in FIG. 17 can transmit a logic signal without any significant decrease in logical amplitude. For example, for transmitting a signal of the reference potential, the transistor M1A drives the potential at an output terminal to approximately the reference potential. For transmitting a signal of the power supply potential, the transistor M1A drives the potential thereof to approximately a potential VDD-Vtn-α. Thereafter, the transistor M1B drives the potential thereof toward the power supply potential. There, Vtn is a threshold voltage of the transistor M1A when a substrate potential is equal to a source potential. α denotes a change in the threshold voltage caused by a back gate effect.

To be more specific, in the logic circuit shown in FIG. 16, when the logic state of an intermediate logic signal is either HIGH or LOW, the potential at an intermediate output node is substantially equal to either the reference potential or power supply potential. Without the use of a pull-up circuit, a static feedthrough current of the CMOS NAND gate can be suppressed. Moreover, logical collision does not occur. Improvement of operation speed and reduction of chip are, can therefore be attained.

The logic circuit shown in FIG. 12 uses two pull-up P-channel MOS transistors, while the logic circuit shown in FIG. 16 uses a total of four P-channel MOS transistors to form four unit pass transistors. However, since the dimension of each P-channel MOS transistor is small, an increase in chip area deriving from an increase in the number of employed P-channel MOS transistors is not significant.

Moreover, the smaller dimension of the P channel MOS transistors limits the increase in a load capacitance for a logic circuit in the preceding stage. Therefore, the degradation in the operation speed is also limited.

If the threshold voltages of N-channel and P-channel MOS transistors constituting a multiple-input CMOS logic gate are set appropriately in accordance with a supply voltage, the logical threshold voltage of the multiple-input CMOS logic gate is generally lower than a potential VDD-Vtn-α enabling driving by N-channel MOS transistors alone. Therefore, even if the driving capacity of P-channel MOS transistors is low, it will not adversely affect the operation speed of the logic circuit of the present invention. For suppressing a static feedthrough current and maintaining a noise margin, P-channel MOS transistors must work so that the potentials at intermediate output nodes approach the power supply potential. However, in an actual operation of a logic circuit, the time during which an intermediate output logic signal of each pass-transistor logic tree stays in either HI or LOW state is generally much longer than the time during which the logic state of the intermediate logic signal is changing. Therefore, even if the driving capacity of P-channel MOS transistors is low, an effect of suppressing a static feedthrough current and maintaining a sufficient noise margin can be exerted satisfactorily.

Note that, the dimension of a P-channel MOS transistor needed to restore a potential during the same period of time are conceivably smaller than the needed dimensions of a pull-up P-channel MOS transistor shown in FIG. 12. In the circuit shown in FIG. 12, the pull-up P-channel MOS transistors are not activated until the output logic signal of the multiple-input CMOS NAND gate is driven low. By contrast, in the circuit of this embodiment, when a HIGH input logic signal is applied to the input terminal of a unit pass transistor, and a LOW input logic signal is applied to the gate of a P-channel MOS transistor, the P-channel MOS transistor is activated.

Figure 18:
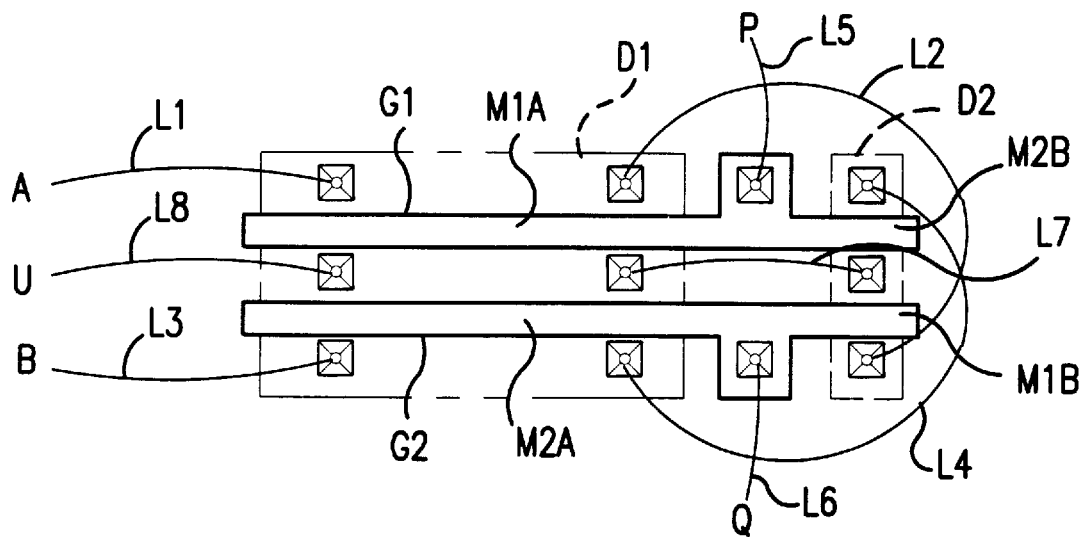
FIG. 18 is a plan view of an example of a pattern suitable for forming the circuit shown in FIG. 17 on the surface of a semiconductor substrate.

The pair pass transistor element T shown in FIG. 17 can be formed on a surface of a semiconductor substrate according to a pattern shown, for example, in FIG. 18, though the present invention is not limited to this implementation or mode. In FIG. 18, a dot-dash line D1 defines a channel area for forming N-channel MOS transistors, and a dot-dash line D2 defines an active area for forming P-channel MOS transistors. Solid lines G1 and G2 define gate electrode areas for forming the N-channel MOS transistors and P-channel MOS transistors. In particular, the gates of the N-channel MOS transistors M1A and M2A and those of the P-channel MOS transistors M1B and M2B, which are shown in FIG. 17, are formed at positions M1A, M2A, M1B, and M2B in FIG. 18. In the pattern shown in FIG. 18, the gate lengths (L) of the N-channel MOS transistors and P-channel MOS transistors are equal. The ratio of the gate widths (w) thereof is generally 6:1.

Figure 19:
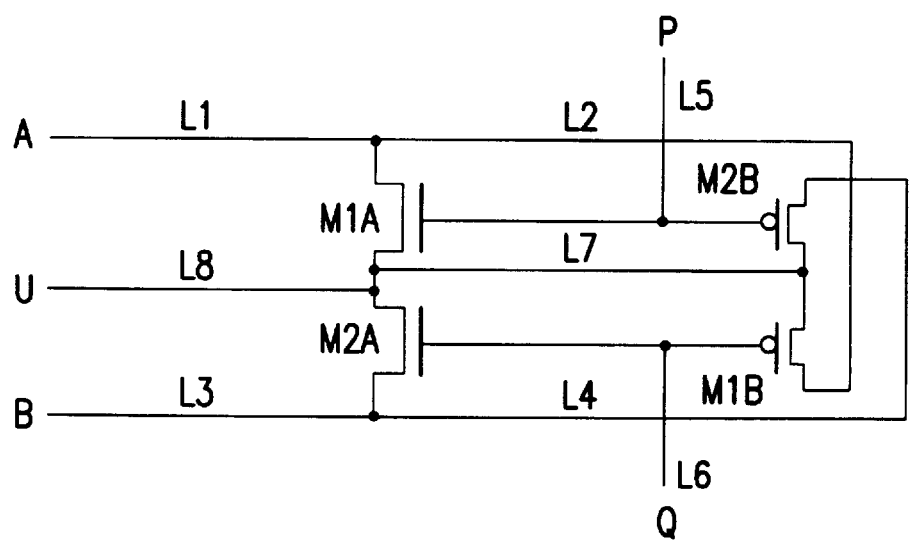
FIG. 19 is a diagram showing an arrangement of transistors in the circuit, which is shown in FIG. 17, formed using the pattern shown in FIG. 18.

Furthermore, in FIG. 19, a pair pass transistor element formed according to the pattern shown in FIG. 18 is shown with the positional relationships among circuit elements associated with those in FIG. 18. In FIGS. 18 and 19, reference numerals L1 to L8 denote interconnections connecting the N-channel MOS transistors M1A and M2A or the P-channel MOS transistors M1B and M2B. Alphabets A, B, P, Q, and U denote the signals shown in FIG. 18.

As shown in FIGS. 18 and 19, the pair pass transistor element T of the present invention can be realized in the form of an integrated circuit according to a simple pattern. This is advantageous in terms of reducing the chip area of a semiconductor integrated circuit including logic circuits of the present invention.

In the logic circuits such as shown in FIGS. 12 and 16, the intermediate output nodes of pass transistor logic trees are directly connected to the intermediate input node of a multiple-input logic gate. However, some or all of the intermediate output nodes may be connected to corresponding intermediate input nodes via inverters so that the intermediate logic signals are received by the intermediate input nodes after the signals are inverted. In the logic circuit shown in FIG. 12, however, logical operation of the multiple-input logic gate should be adjusted in order to feed back the output logic signal of the multiple-input logic gate directly to the pull-up transistors.

In a third embodiment, examples of logic circuits of the present invention having various numbers of pass-transistor logic trees having various numbers of stages will be presented below by centering on those logic circuits using pair pass transistor element.

Figure 20:
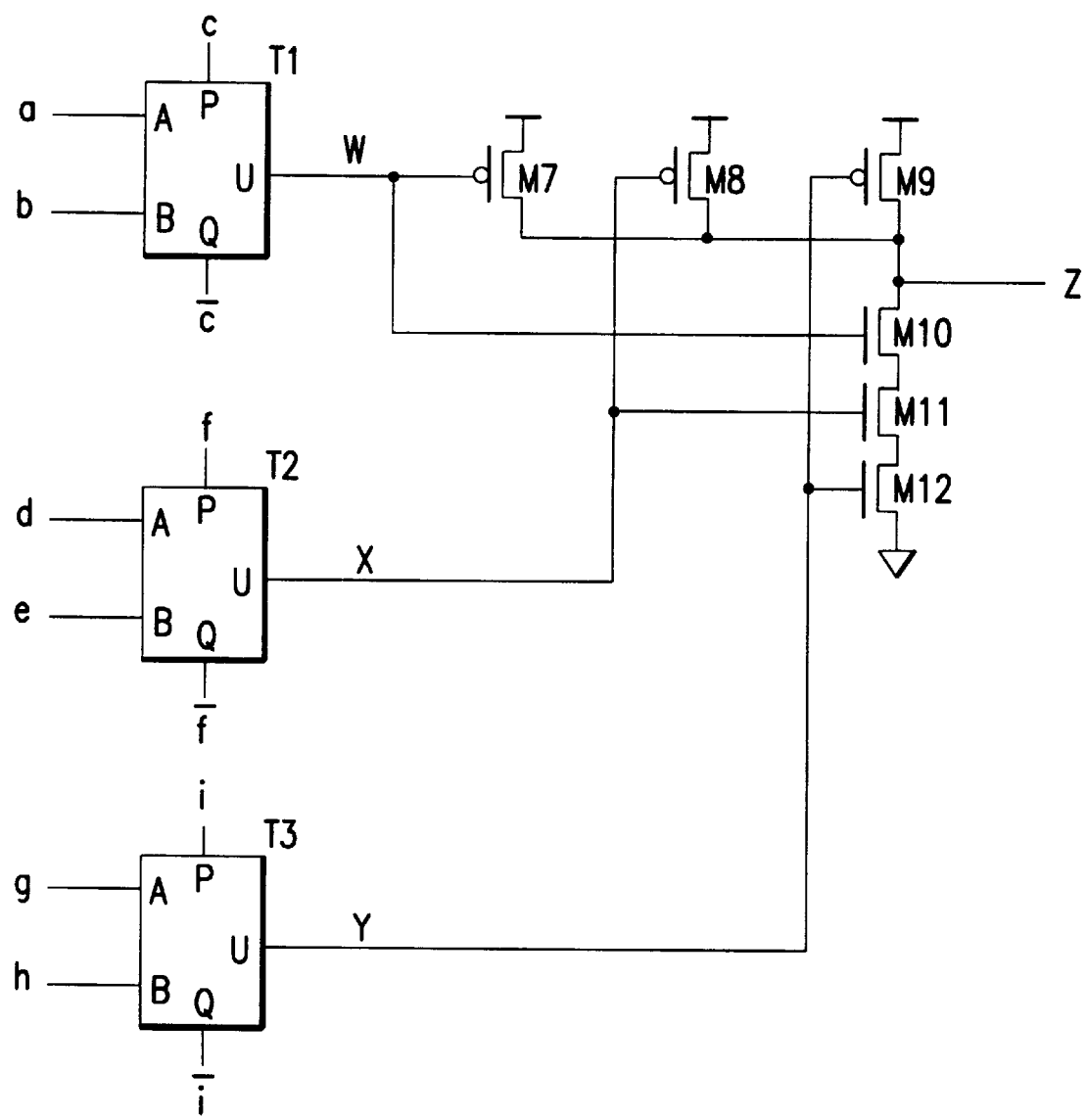
FIGS. 20 to 24 are circuit diagrams of logic circuits of the present invention having various numbers of pass transistor logic trees that have various numbers of stages and that are configured using paired pass transistor elements.

FIG. 20 is a circuit diagram of a pass-transistor logic circuit of the present invention having three single-stage pass-transistor logic trees.

In the embodiment shown in FIG. 20, a first pass-transistor logic tree is formed with a pair pass transistor element T1. The first pass-transistor logic tree calculates an operation expressed below using logic signal a to c, and produces an intermediate logic signal W.

$$W = a \cdot c + b \cdot \bar{c} \quad (16)$$

A second pass-transistor logic tree is formed with a pair pass transistor element T2. The second pass-transistor logic tree calculates an operation expressed below using logic signals d to f, and produces an intermediate logic signal X.

$$X = d \cdot f + e \cdot \bar{f} \quad (17)$$

A third pass-transistor logic tree is formed with a pair pass transistor element T3. The third pass-transistor logic tree calculates an operation expressed below using logic signals g to i, and produces an intermediate logic signal Y.

$$Y = g \cdot i + h \cdot \bar{i} \quad (18)$$

A triple-input CMOS NAND gate composed of N-channel MOS transistors M10 to M12 and P-channel MOS transistors M7 to M9 is formed as a multiple-input logic gate. The triple-input NAND gate receives the signals W to Y output from the first to third pass-transistor logic trees through associated intermediate input nodes, calculates an operation expressed below, and produces an output logic signal Z.

$$\begin{aligned} Z &= \overline{W \cdot X \cdot Y} \\ &= \overline{W} + \overline{X} + \overline{Y} \end{aligned} \quad (19)$$

A logical operation for producing the output logic signal Z and a logical operation for producing an output signal $\overline{Z}$ that is complementary to the output logic signal Z, which are calculated by the whole logic circuit of this embodiment, are expressed as follows:

$$\begin{aligned} Z &= \overline{W} + \overline{X} + \overline{Y} \\ &= \overline{\underline{(a \cdot c + b \cdot \bar{c})}} + \overline{\underline{(d \cdot f + e \cdot \bar{f})}} + \overline{\underline{(g \cdot i + h \cdot \bar{i})}} \\ &= \overline{a \cdot c + b \cdot \bar{c} + d \cdot f + e \cdot \bar{f} + g \cdot i + h \cdot \bar{i}} \end{aligned} \quad (19)$$

$$\begin{aligned} \overline{Z} &= \overline{\overline{W \cdot X \cdot Y}} \\ &= \overline{(a \cdot c + b \cdot \bar{c}) \cdot (d \cdot f + e \cdot \bar{f}) \cdot (g \cdot i + h \cdot \bar{i})} \\ &= a \cdot c \cdot d \cdot f \cdot g \cdot i + a \cdot c \cdot d \cdot f \cdot h \cdot \bar{i} + \\ &\quad a \cdot c \cdot e \cdot \bar{f} \cdot g \cdot i + a \cdot c \cdot e \cdot \bar{f} \cdot h \cdot \bar{i} + \\ &\quad b \cdot \bar{c} \cdot d \cdot f \cdot g \cdot i + b \cdot \bar{c} \cdot d \cdot f \cdot h \cdot \bar{i} + \\ &\quad b \cdot \bar{c} \cdot e \cdot \bar{f} \cdot g \cdot i + b \cdot \bar{c} \cdot e \cdot \bar{f} \cdot h \cdot \bar{i} \end{aligned} \quad (21)$$

As apparent from the expressions (20) and (21), the number of variables dealt with by this embodiment is a maximum of nine (logic signal& a to i). As seen from the expression (20), when an output logic signal is supposed to be active high, up to six product terms each containing two variables can be expressed. By contrast, when the output logic signal is supposed to be active low, up to eight product terms each containing six variables can be expressed.

Figure 21:
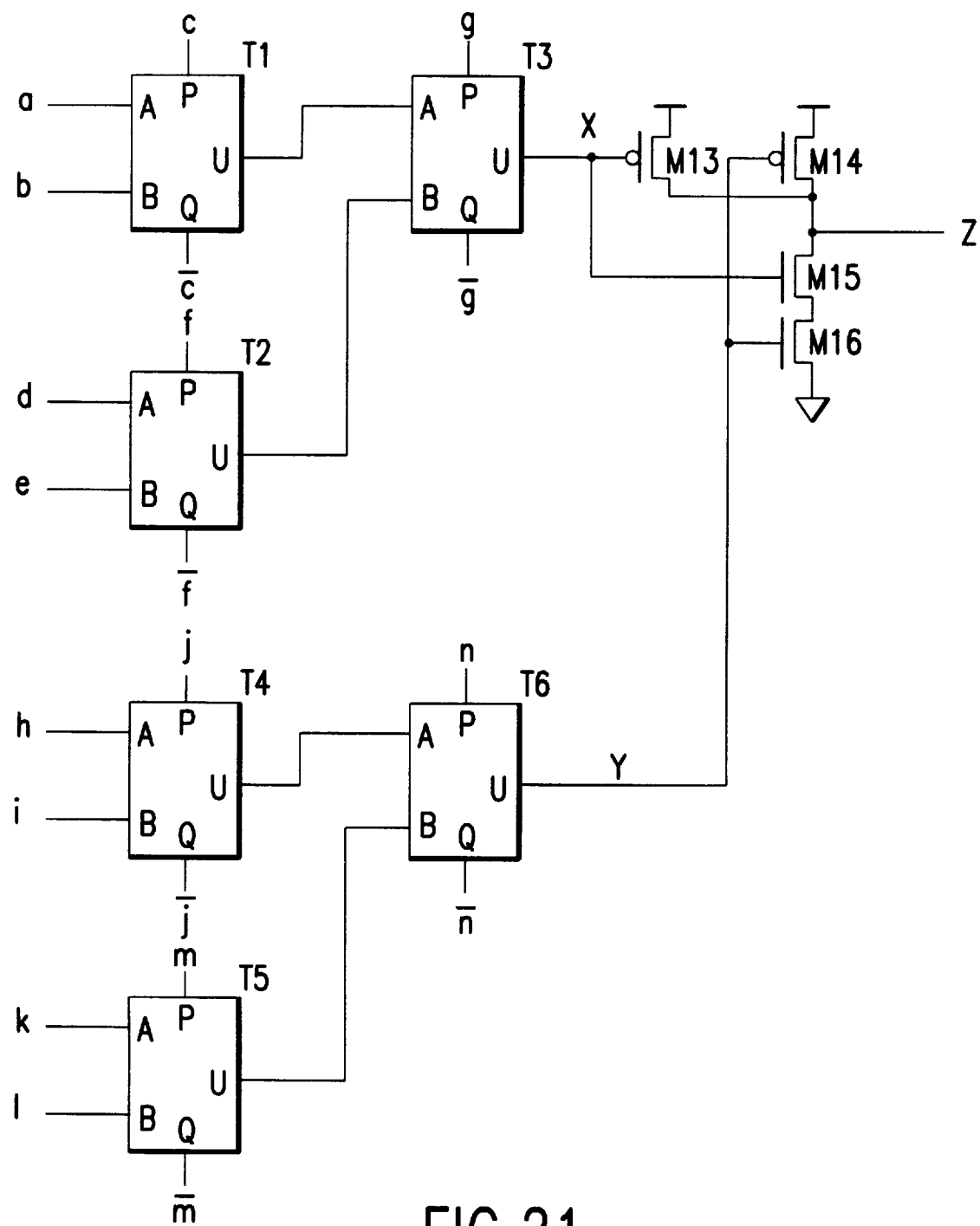

FIG. 21 is a circuit diagram of an embodiment of the present invention having two dual-stage pass-transistor logic trees.

A first pass-transistor logic tree is composed of pair pass transistor elements T1 to T3. First and second first-stage pass transistors formed with the pair pass transistor element T1 and pair pass transistor element T2 are connected to pass transistors in the second stage which is formed with the pair pass transistor element T3. The first pass-transistor logic tree calculates a logical operation below using logic signals a to g, and produces an intermediate logic signal X.

$$X = a \cdot c \cdot g + b \cdot \bar{c} \cdot g + d \cdot f \cdot \bar{g} + e \cdot \bar{f} \cdot \bar{g} \quad (22)$$

Next, a second pass-transistor logic tree is composed of pair pass transistor elements T4 to T6, calculates an operation expressed below using logic signals h to n, and produces an intermediate logic signal Y.

$$Y = h \cdot j \cdot n + i \cdot \bar{j} \cdot n + K \cdot m \cdot \bar{n} + l \cdot \bar{m} \cdot \bar{n} \quad (23)$$

A dual-input CMOS NAND gate is included as a multiple-input logic gate. The dual-input CMOS NAND gate receives the intermediate logic signals X and Y through associated intermediate input nodes thereof, calculates a logical operation expressed below, and produces an output logic signal Z.

$$Z = \overline{X \cdot Y} = \overline{X} + \overline{Y} \quad (24)$$

A logical operation for producing the output logic signal Z and a logical operation for producing an output logic signal $\overline{Z}$ that is complementary to the signal Z, which are performed by the whole logic circuit of this embodiment, are expressed as follows:

$$\begin{aligned} Z = \ &\bar{a} \cdot c \cdot g + \bar{b} \cdot \bar{c} \cdot g + \bar{d} \cdot f \cdot \bar{g} + \\ &\bar{e} \cdot \bar{f} \cdot \bar{g} + \bar{h} \cdot j \cdot n + \bar{i} \cdot \bar{j} \cdot n + \\ &\bar{k} \cdot m \cdot \bar{n} + \bar{l} \cdot \bar{m} \cdot \bar{n} \end{aligned} \quad (25)$$

$$\begin{aligned} \overline{Z} = \ &a \cdot c \cdot g \cdot h \cdot j \cdot n + a \cdot c \cdot g \cdot i \cdot \bar{j} \cdot n + \\ &a \cdot c \cdot g \cdot k \cdot m \cdot \bar{n} + a \cdot c \cdot g \cdot i \cdot \bar{m} \cdot \bar{n} + \\ &b \cdot \bar{c} \cdot g \cdot h \cdot j \cdot n + b \cdot \bar{c} \cdot g \cdot i \cdot \bar{j} \cdot n + \\ &b \cdot \bar{c} \cdot g \cdot k \cdot m \cdot \bar{n} + \\ &b \cdot \bar{c} \cdot g \cdot l \cdot \bar{m} \cdot \bar{n} + \\ &d \cdot f \cdot \bar{g} \cdot h \cdot j \cdot n + \\ &d \cdot f \cdot \bar{g} \cdot i \cdot \bar{j} \cdot n + \\ &d \cdot f \cdot \bar{g} \cdot k \cdot m \cdot \bar{n} + \\ &d \cdot f \cdot \bar{g} \cdot l \cdot \bar{m} \cdot \bar{n} + \\ &e \cdot \bar{f} \cdot \bar{g} \cdot h \cdot j \cdot n + \\ &e \cdot \bar{f} \cdot \bar{g} \cdot i \cdot \bar{j} \cdot n + \\ &e \cdot \bar{f} \cdot \bar{g} \cdot k \cdot m \cdot \bar{n} + \\ &e \cdot \bar{f} \cdot \bar{g} \cdot l \cdot \bar{m} \cdot \bar{n} \end{aligned} \quad (26)$$

As apparent from the expressions (25) and (26), the number of variables dealt with by the logic circuit of this embodiment is a maximum of 14 (logic signals a to n). When an output logic signal is supposed to be active high, a total of eight product terms each containing three variables can be expressed. By contrast, when the output logic signal is supposed to be active low, a total of 16 product terms each containing six variables can be expressed.

Figure 22:
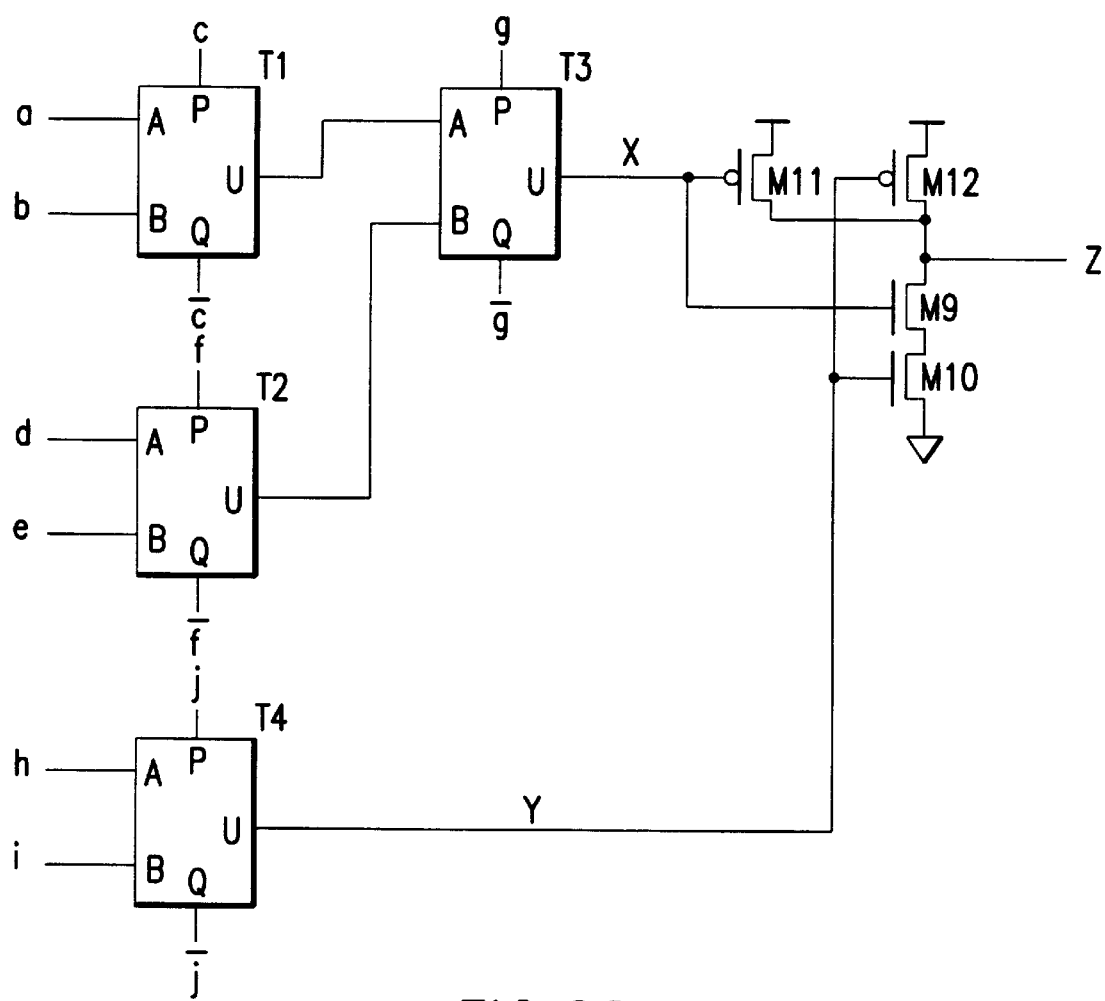

FIG. 22 is a circuit diagram of a logic circuit of the present invention having one single-stage pass-transistor logic tree and one dual-stage pass-transistor logic tree.

A first pass-transistor logic tree has a dual-stage configuration, consists of pair pass transistor elements T1 to T3, calculates a logical operation expressed below using logic signals a to g, and produces an intermediate logic signal X.

$$X = a \cdot c \cdot g + b \cdot \bar{c} \cdot g + d \cdot f \cdot \bar{g} + e \cdot \bar{f} \cdot \bar{g} \quad (27)$$

A second pass-transistor logic tree has a signal-stage configuration, includes a pair pass transistor element T4, calculates a logical operation expressed below using logic signals h to j, and produces an intermediate logic signal Y.

$$Y = h \cdot j + i \cdot \bar{j} \quad (28)$$

Furthermore, the logic circuit of this embodiment uses a dual-input CMOS NAND gate as a multiple-input logic gate. The dual-input CMOS NAND gate calculates a logical operation expressed below, and produces an output logic signal Z.

$$Z = \overline{X \cdot Y} = \bar{X} + \bar{Y} \quad (29)$$

A logical operation for producing the output signal Z and a logical operation for producing an output signal $\bar{Z}$ that is complementary to the signal Z, which are computed by the whole logic circuit of this embodiment, are expressed as follows:

$$Z = \bar{a} \cdot c \cdot g + \bar{b} \cdot \bar{c} \cdot g + \bar{d} \cdot f \cdot \bar{g} + \bar{e} \cdot \bar{f} \cdot \bar{g} + h \cdot j + i \cdot \bar{j} \quad (30)$$

$$\bar{Z} = a \cdot c \cdot g \cdot h \cdot j + a \cdot c \cdot g \cdot i \cdot \bar{j} + \quad (31)$$
$$b \cdot \bar{c} \cdot g \cdot h \cdot j + b \cdot \bar{c} \cdot g \cdot i \cdot \bar{j} +$$
$$d \cdot f \cdot \bar{g} \cdot h \cdot j + d \cdot f \cdot \bar{g} \cdot i \cdot \bar{j} +$$
$$e \cdot \bar{f} \cdot \bar{g} \cdot h \cdot j + e \cdot \bar{f} \cdot \bar{g} \cdot i \cdot \bar{j}$$

As apparent from the expressions (30) and (31), the number of variables dealt with by the logic circuit of this embodiment is a maximum of ten (logic signals a to j). When an output signal is supposed to be active high, up to four product terms each containing three variables and up to two product terms each containing two variables can be expressed. When the output signal is supposed to be active low, a total of eight product terms each containing five variables can be expressed.

Figure 23:
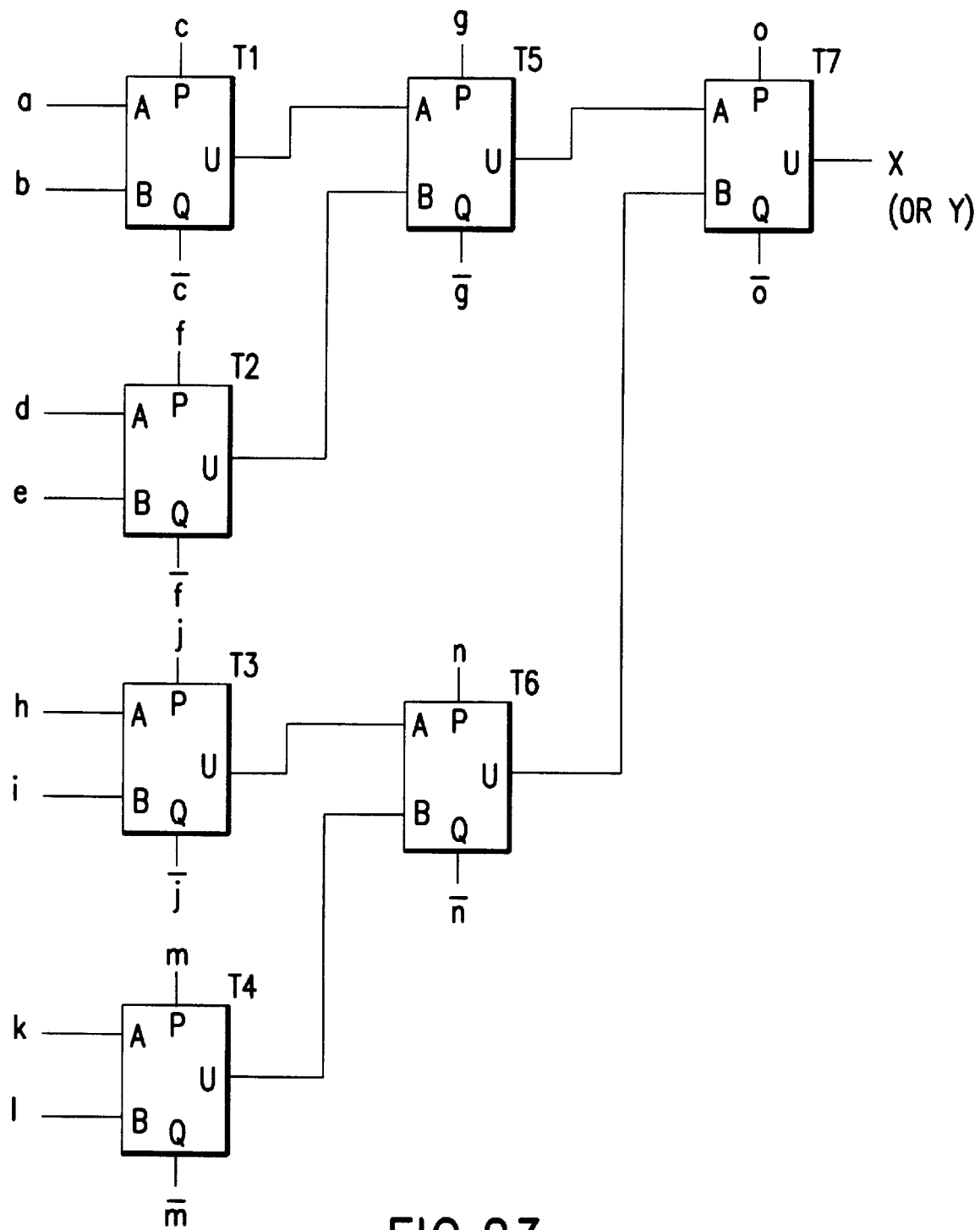
Figure 24:
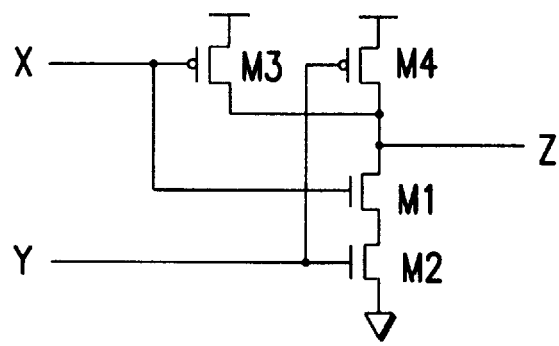

FIGS. 23 and 24 are circuit diagrams of an embodiment of the present invention having two triple-stage pass-transistor logic trees.

FIG. 23 is a circuit diagram of a first pass-transistor logic tree for outputting an intermediate logic signal X. At the same time, FIG. 23 is a circuit diagram of a second pass-transistor logic tree for outputting an intermediate logic signal Y. The first and second pass-transistor logic trees are triple-stage pass-transistor logic circuits, calculate a logical operation expressed below, and produce the intermediate logic signal X and analogous intermediate logic signal Y.

$$\begin{aligned} X &= o \cdot g \cdot (a \cdot c + b \cdot \bar{c}) + o \cdot \bar{g} \cdot \quad (32) \\ &\quad (d \cdot f + e \cdot \bar{f}) + \bar{o} \cdot n \cdot (h \cdot j + i \cdot \bar{j}) + \\ &\quad \bar{o} \cdot \bar{n} \cdot (k \cdot m + l \cdot \bar{m}) \\ &= a \cdot c \cdot g \cdot o + b \cdot \bar{c} \cdot g \cdot o + d \cdot f \cdot \bar{g} \cdot o + \\ &\quad e \cdot \bar{f} \cdot \bar{g} \cdot o + h \cdot j \cdot n \cdot \bar{o} + \\ &\quad i \cdot \bar{j} \cdot n \cdot \bar{o} + k \cdot m \cdot \bar{n} \cdot \bar{o} + \\ &\quad l \cdot \bar{m} \cdot \bar{n} \cdot \bar{o} \end{aligned}$$

FIG. 24 is a circuit diagram of a dual-input CMOS NAND gate that is a multiple-input CMOS logic gate of this embodiment. The CMOS NAND gate calculates a logical operation expressed below.

$$Z = \overline{X \cdot Y} = \bar{X} + \bar{Y} \quad (33)$$

When the expression (32) expressing the logical operation for producing the intermediate logic signal X and an expression analogous to the expression (32) for expressing a logical operation for producing the intermediate logic signal Y (the logic operations are identical to those of the expression (32) but the logic signals involved are different) are assigned to the expression (33), a logical operation to be calculated by the whole logic circuit of this embodiment can be drawn out. The number of variables dealt with in the logical operation of this embodiment is a maximum of 30. When an output logic signal is supposed to be active high, up to 16 product terms each containing four variables can be expressed. When the output logic signal is supposed to be active low, up to 64 product terms each containing eight variables can be expressed.

Likewise, a configuration including three dual-stage pass-transistor logic trees, a configuration including four single-stage pass-transistor logic trees, or a combination thereof can be realized.

However, it is generally not preferable to unnecessarily increase the number of stages in a pass-transistor logic tree. For example, an input logic signal (for example, a signal a) input to the left-hand pass transistor and an input logic signal (for example, a signal o) input to the right-hand pass transistor are greatly different from each other in terms of the number of pass steps and a load capacitance for a logic circuit in the preceding stage. A difference in operation timing therefore becomes large. This makes it hard to verify operation timing. When, for example, only a partial modification of design is made, verification must be performed again on the entire operation timing.

It is therefore preferable to select the number of stages in a pass-transistor logic tree and the number of pass-transistor logic trees appropriately within practical ranges.

In the aforesaid embodiments, a NAND gate is used as a multiple-input logic gate. However, the present invention is not limited to this implementation or mode. FIGS. 25 to 28 are circuit diagrams of an embodiment of the present invention using a dual-input NOR gate as a multiple-input logic gate.

Figure 25:
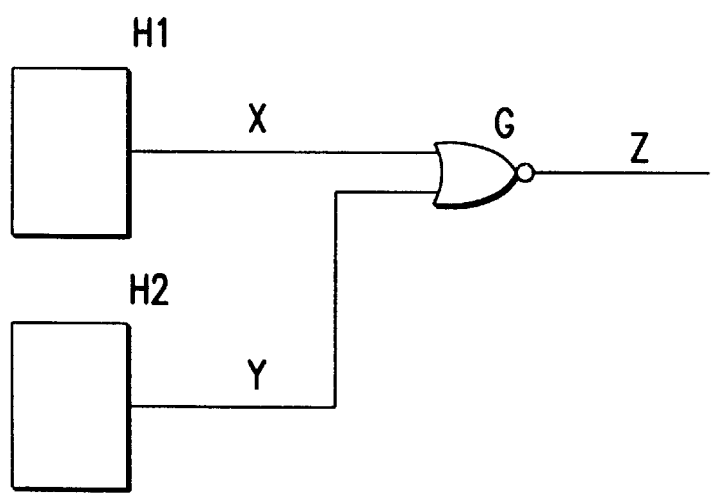
FIGS. 25 to 28 are circuit diagrams of examples of logic circuits of the present invention that are configured using a NOR gate.
Figure 26:
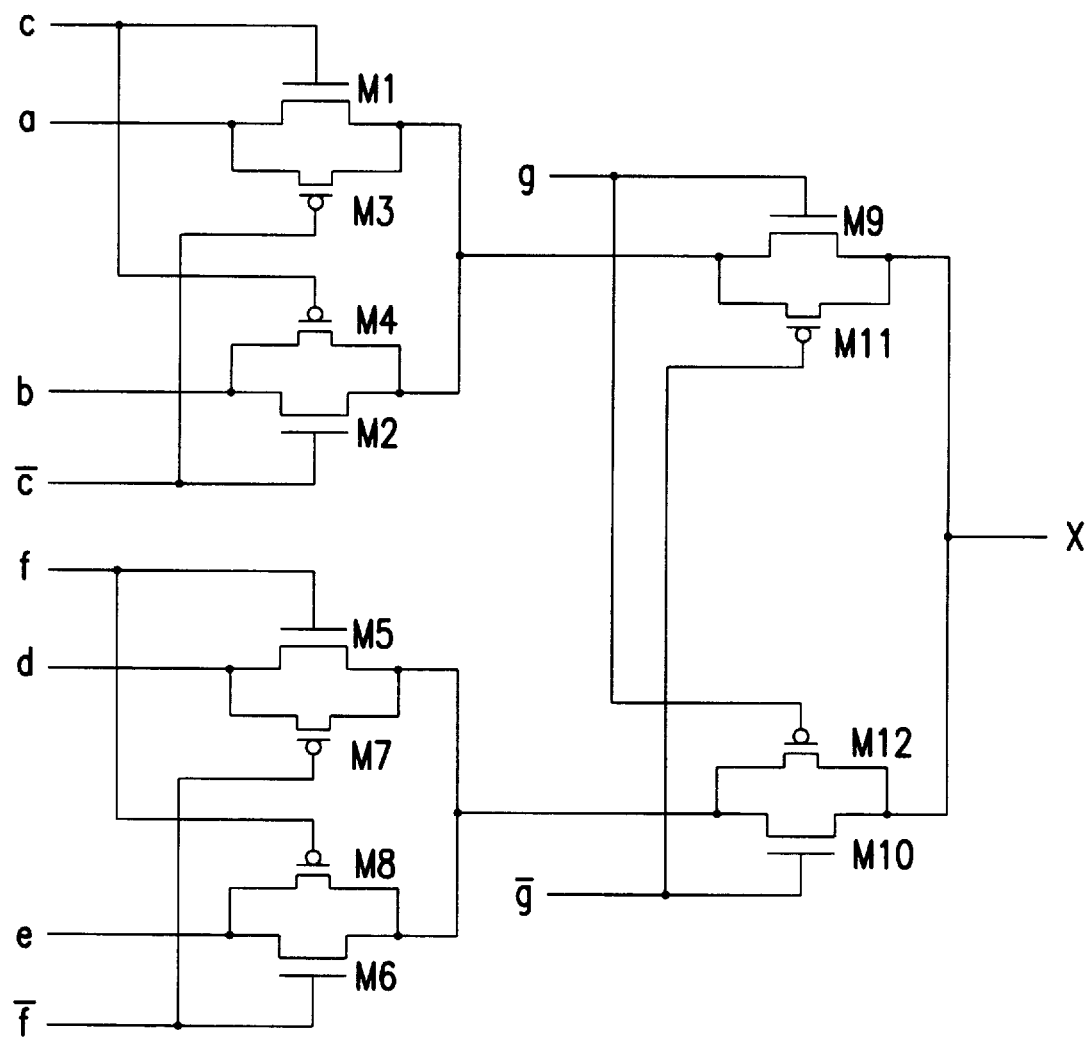
Figure 27:
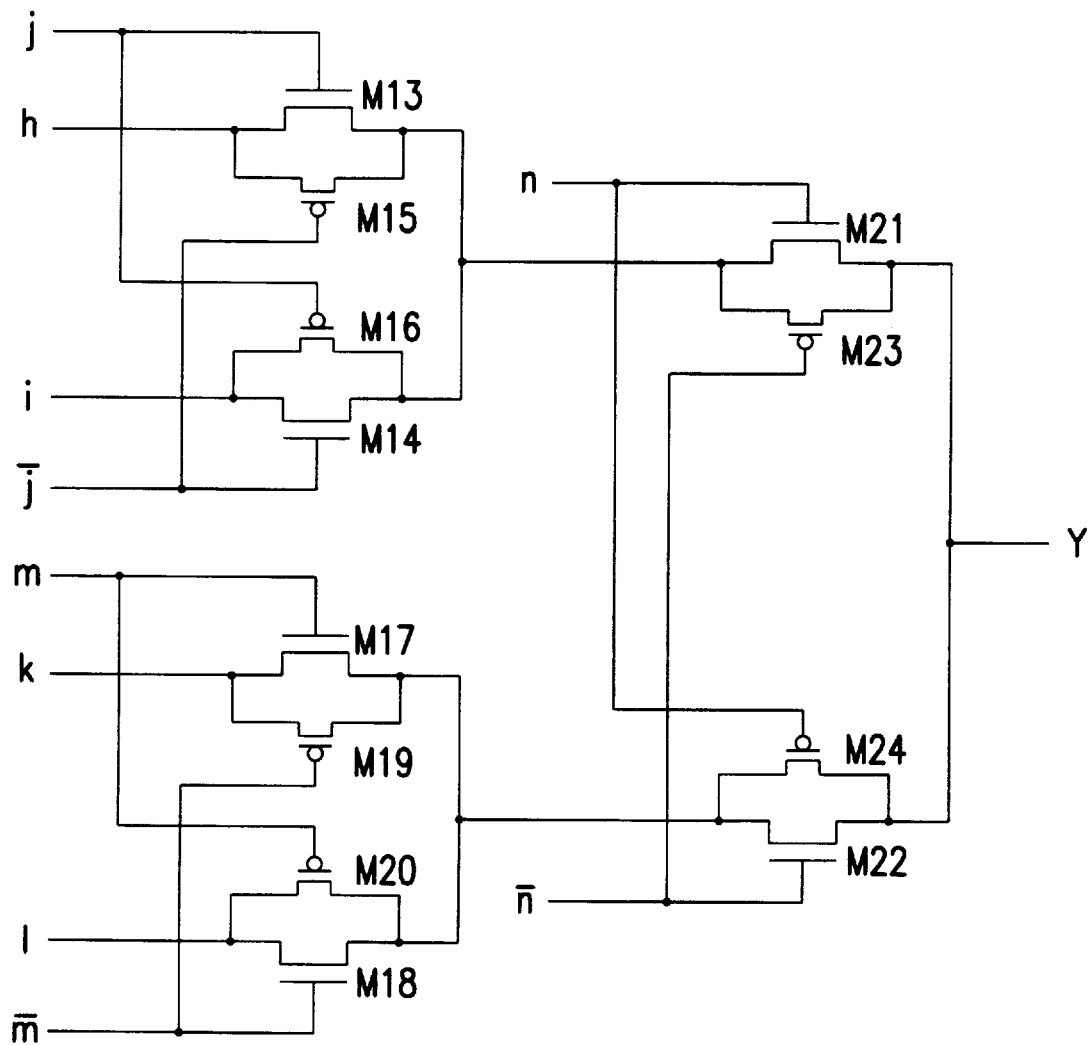
Figure 28:
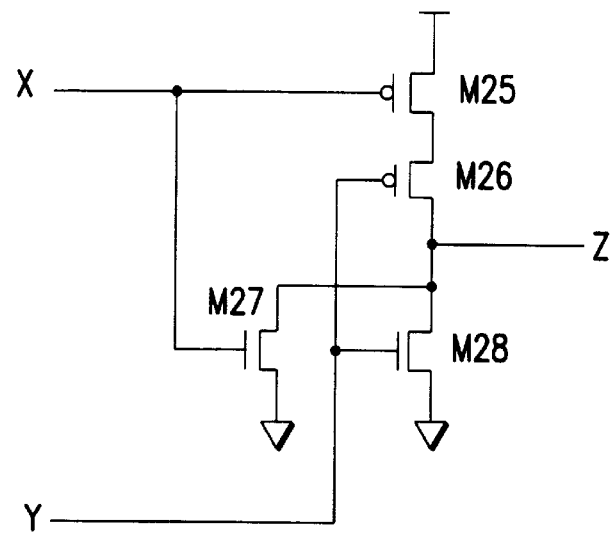

FIG. 25 shows the whole of a logic circuit of this embodiment. This embodiment comprises pass-transistor logic trees H1 and H2 and a dual-input NOR logic gate G. FIG. 26 shows the pass-transistor logic tree H1, FIG. 27 shows the pass-transistor logic tree H2, and FIG. 28 shows the dual-input NOR logic gate G.

Each of the pass-transistor logic trees H1 and H2 consists of two stages of pass transistors. The pass-transistor logic trees H1 and H2 calculate logical operations given as expressions (34) and (35) below. Furthermore, the dual-input NOR logic gate G calculates an operation using an intermediate logic signal X provided by the first pass-transistor logic tree and an intermediate logic signal Y provided by the second pass-transistor logic tree according to expressions (36) and (37) below, and produces an output signal Z.

$$X = a \cdot c \cdot g + b \cdot \bar{c} \cdot g + d \cdot f \cdot \bar{g} + e \cdot \bar{f} \cdot \bar{g} \quad (34)$$

$$Y = h \cdot j \cdot n + i \cdot \bar{j} \cdot n + k \cdot m \cdot \bar{n} + l \cdot \bar{m} \cdot \bar{n} \quad (35)$$

$$\bar{Z} = X + y \quad (36)$$

$$Z = \overline{X + Y} = \bar{X} \cdot \bar{Y} \quad (37)$$

Consequently, logical operations calculated by the whole logic circuit of this embodiment are given as the following expressions (38) and (39):

$$\bar{Z} = a \cdot c \cdot g + b \cdot \bar{c} \cdot g + d \cdot f \cdot \bar{g} + \quad (38)$$
$$e \cdot \bar{f} \cdot \bar{g} + h \cdot j \cdot n + i \cdot \bar{j} \cdot n +$$
$$k \cdot m \cdot \bar{n} + l \cdot \bar{m} \cdot \bar{n}$$

-continued $$Z = \bar{a} \cdot c \cdot g \cdot h \cdot j \cdot n + \bar{a} \cdot c \cdot g \cdot \bar{i} \cdot \bar{j} \cdot n + \quad (39)$$

$$\bar{a} \cdot c \cdot g \cdot \bar{k} \cdot m \cdot \bar{n} +$$
$$\bar{a} \cdot c \cdot g \cdot \bar{l} \cdot \bar{m} \cdot \bar{n} +$$
$$\bar{b} \cdot \bar{c} \cdot g \cdot h \cdot j \cdot n +$$
$$\bar{b} \cdot \bar{c} \cdot g \cdot \bar{i} \cdot \bar{j} \cdot n +$$
$$\bar{b} \cdot \bar{c} \cdot g \cdot \bar{k} \cdot m \cdot \bar{n} +$$
$$\bar{b} \cdot \bar{c} \cdot g \cdot \bar{l} \cdot \bar{m} \cdot \bar{n} +$$
$$\bar{d} \cdot f \cdot \bar{g} \cdot h \cdot j \cdot n +$$
$$\bar{d} \cdot f \cdot \bar{g} \cdot \bar{i} \cdot \bar{j} \cdot n +$$
$$\bar{d} \cdot f \cdot \bar{g} \cdot \bar{k} \cdot m \cdot \bar{n} +$$
$$\bar{d} \cdot f \cdot \bar{g} \cdot \bar{l} \cdot \bar{m} \cdot \bar{n} +$$
$$\bar{e} \cdot \bar{f} \cdot \bar{g} \cdot h \cdot j \cdot n +$$
$$\bar{e} \cdot \bar{f} \cdot \bar{g} \cdot \bar{i} \cdot \bar{j} \cdot n +$$
$$\bar{e} \cdot \bar{f} \cdot \bar{g} \cdot \bar{k} \cdot m \cdot \bar{n} +$$
$$\bar{e} \cdot \bar{f} \cdot \bar{g} \cdot \bar{l} \cdot \bar{m} \cdot \bar{n}$$

Both when the output signal is supposed to be active low as it is provided according to the expression (38), or when it is supposed to be active high as it is provided according to the expression (39), the number of variables that can be dealt with by this embodiment, that is, the number of input logic signals is at maximum of 14. The input logic signals a to n can be dealt with. When the output signal is supposed to be active low, up to eight product terms each containing three variables can be expressed. When the output signal is supposed to be active high, up to 16 product terms each containing six variables can be expressed.

The logic circuit of the present invention using a multiple-input NOR gate, which is shown in FIGS. 25 to 28, has the same ability as the logic circuit of the present invention using a multiple-input NAND gate, which is shown in FIG. 21, in terms of the numbers of variables and product terms that can be dealt with. However, from the viewpoint of operation speed, the logic circuit using a NAND gate is more advantageous than the other one. This is attributable to a difference in the time required for raising the potential at an input node of a logic circuit in a succeeding stage.

Figure 29:
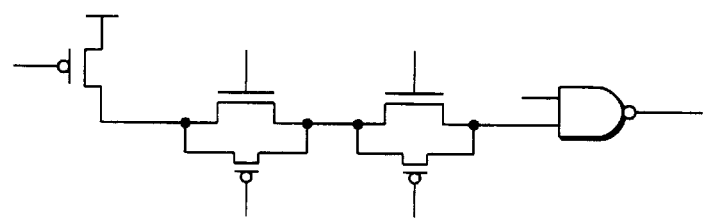
FIGS. 29 and 30 are circuit diagrams used to compare a logic circuit of the present invention configured using a NAND gate with a logic circuit of the present invention configured using a NOR gate in terms of raising the potential at an input node of a logic circuit in a succeeding stage.
Figure 30:
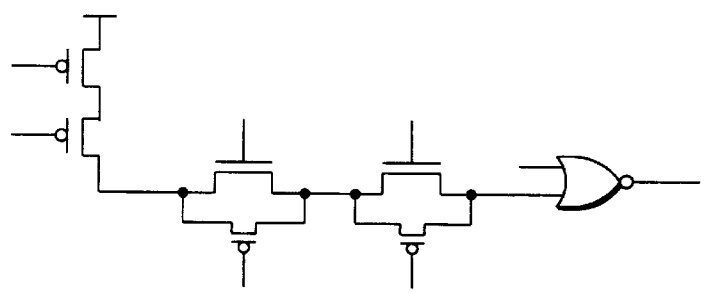

FIG. 29 shows a state in which an output node of a NAND gate is coupled with an input node of a logic circuit in a succeeding stage having a dual-stage pass transistor logic tree and a NAND gate. By contrast, FIG. 30 shows a state in which an output node of a NOR gate is coupled with an input node of a logic circuit in a succeeding stage having a dual-stage pass-transistor logic tree and a NOR gate. When these drawings are compared, it is seen that the logic circuit having a NOR gate is disadvantageous for raising the potential at the input node, because two P-channel MOS transistors connected in series, each of which has driving capacity lower than that of N-channel MOS transistor, drive the input node.

According to the method of pulling up a potential in response to an output logic signal of a multiple-input logic gate, logic circuits of the present invention having different numbers of stages in a pass-transistor logic tree and different numbers of pass-transistor logic trees can be configured.

Figure 31:
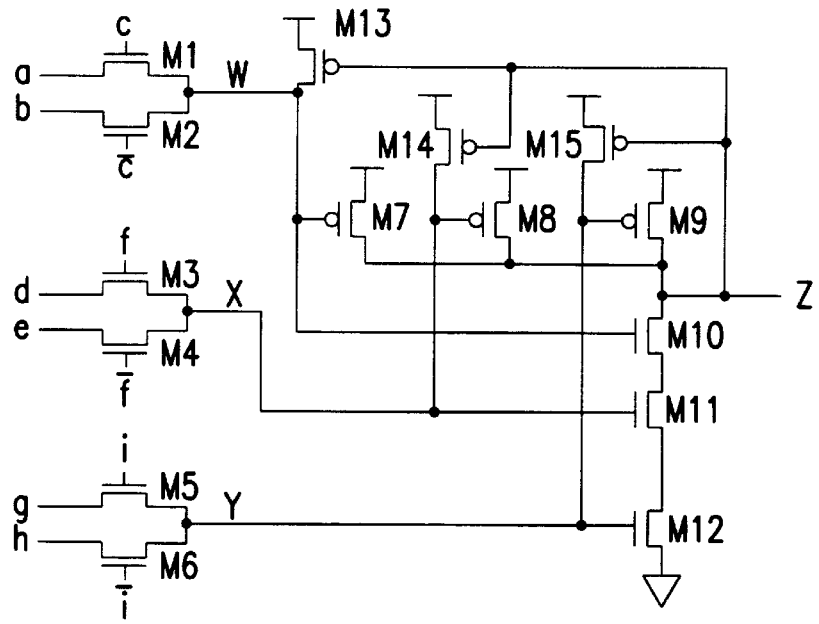
FIGS. 31 to 35 are circuit diagrams of logic circuits of the present invention having various numbers of pass transistor logic trees that have various stages and that perform pull-up according to an output logic signal of a multiple-input logic gate.

FIG. 31 is a circuit diagram of an embodiment of a pass-transistor logic circuit of the present invention having three single-stage pass-transistor logic trees. P-channel MOS transistors M13 to M15 constitute a pull-up circuit.

Figure 32:
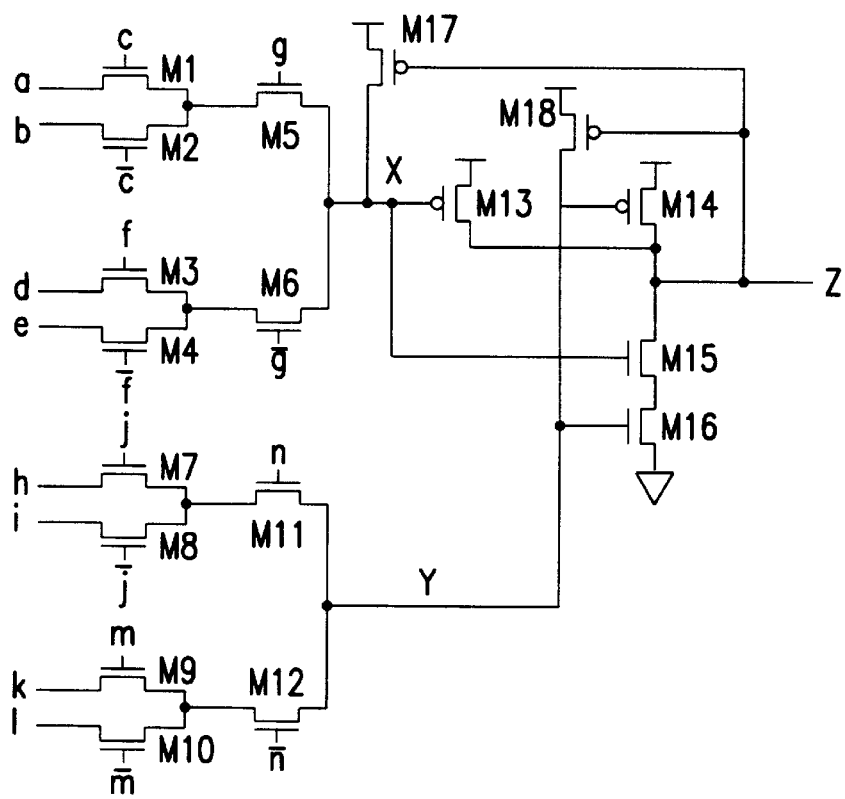

FIG. 32 is a circuit diagram of an embodiment of the present invention having two dual-stage pass-transistor logic trees. P-channel MOS transistors M17 and M18 constitutes a pull-up circuit.

Figure 33:
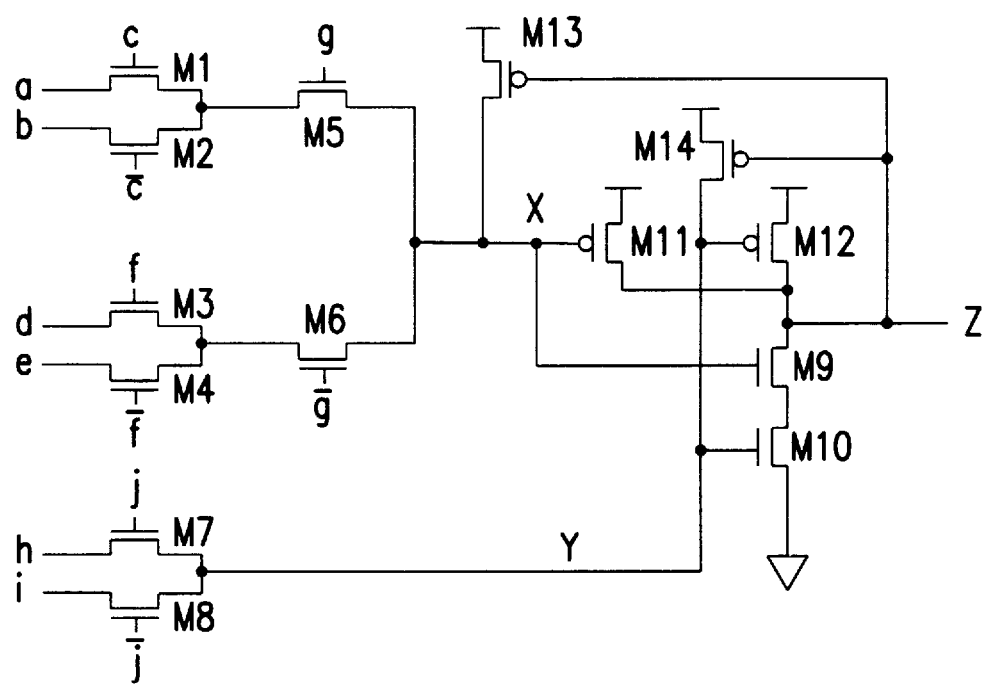

FIG. 33 is a circuit diagram of a logic circuit of an embodiment of the present invention having one single-stage pass-transistor logic tree and one dual-stage pass-transistor logic tree. P-channel MOS transistors M13 and M14 constitute a pull-up circuit.

Figure 34:
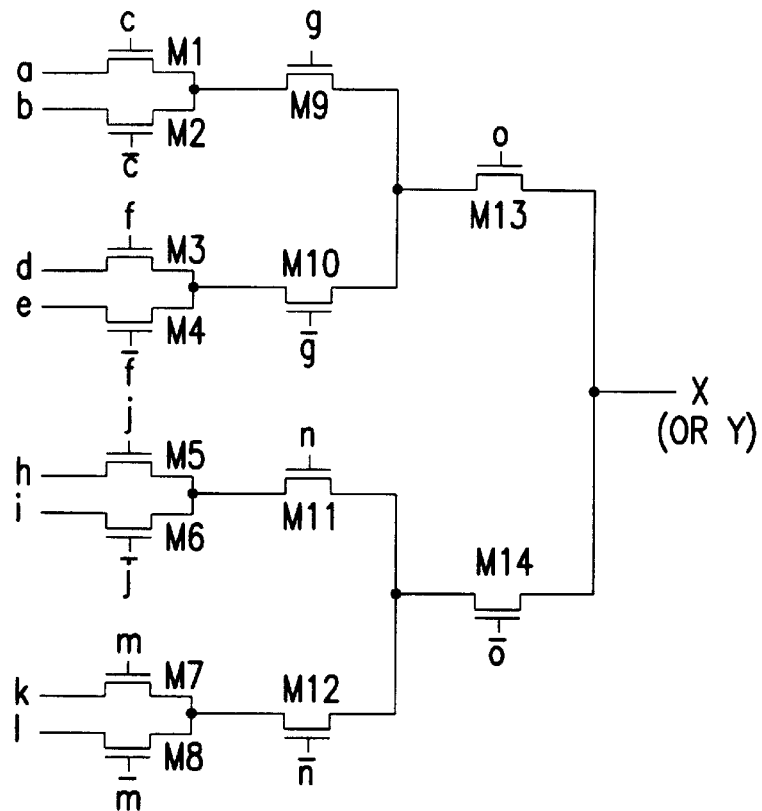
Figure 35:
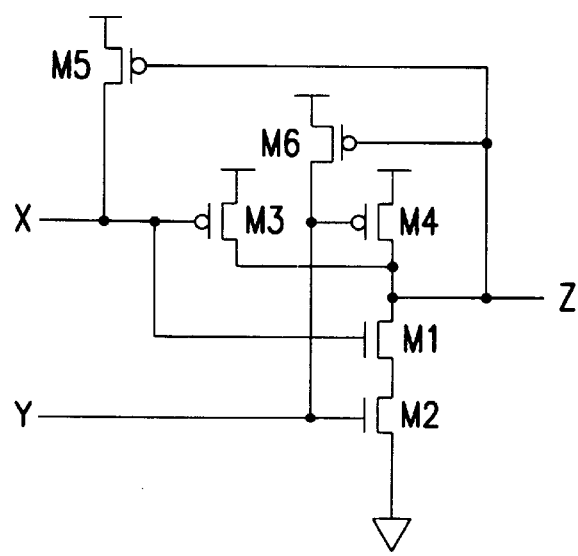

FIGS. 34 and 35 are circuit diagrams showing an embodiment of the present invention having two triple-stage pass-transistor logic trees.

Referring to FIGS. 36 to 46, a logic circuit of the present invention will be compared with a known pass-transistor logic circuit or CMOS logic circuit which expresses the same logical operation. The logic circuits are compared especially in terms of the number of transistors that is a determinant of chip area, the number of pass steps that is a determinant of operation speed, and the number of loads that is a determinant of operation speed and power consumption. Thus, advantages of the logic circuit of the present invention will be clarified.

In practice, transistors used in pass-transistor logic circuits and those in CMOS logic circuits have different characteristic. In addition, N-channel MOS transistors and P-channel MOS transistors also have different characteristics. However, herein, these differences are not taken into account. Moreover, transistors employed for inverting input logic signals are not included in the number of transistors.

Figure 36:
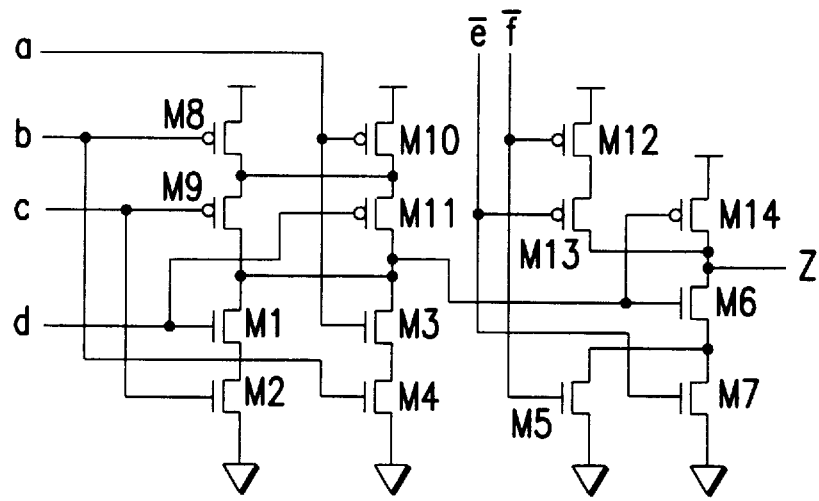
FIG. 36 is a circuit diagram of an example of a known CMOS complex gate for calculating a logical operation provided as an expression (40)

A CMOS logic circuit may be configured by combining simple logic gates such as NAND, NOR, AND, OR gate, or the like. However, in reality, a highly efficient circuits referred to as complex gates among primitive logic cells Ls widely adopted. FIG. 36 is a circuit diagram of a CMOS complex gate for, for example, calculating a logical operation expressed below.

$$Z = a \cdot b + c \cdot d + e \cdot f \quad (40)$$

The complex gate in made by connecting a CMOS logic gate of the first stage composed of N-channel MOS transistors M1 to M4 and P-channel MOS transistors MS to M11 in series with a CMOS logic gate of the second stage composed of N-channel MOS transistors MS to M7 and P-channel MOS transistors M12 to M14. For example, in the first-stage logic gate, two pairs of P-channel MOS transistors (a pair of transistors M8 and M10 and a pair of transistors M9 and M11), each of which transistors are connected in parallel, are connected in series between the first power supply means for supplying VDD potential and an output node. Furthermore, two pairs of N-channel MOS transistors (a pair of transistors M1 and M2 and a pair of transistors M3 and M4), each of which transistors are connected in series, are connected in parallel between the second power supply means for supplying GND potential and the output node.

The number of pass steps in this circuit is three, and the number of transistors is 14. The number of loads is eight. Here, what is referred to as "the number of pass steps" is the number of switching devices (MOS transistors) existent along a signal transmission route. In the case of a CMOS logic gate, presumably, a signal of VDD or GND potential supplied from the first or second power supply means passes through the transistors. "The number of loads" corresponds to a capacitance to be driven by a logic circuit in a preceding stage, and is calculated as the numbers of sources, drains, and gates of transistors to be driven in response to a signal applied to an input node. Here, a gate capacitance is presumed to be three times as large as drain or source diffusion capacitance. The number of loads and the number of pass steps are different from input node to input node. Here, typical values are presented. The number of pass steps in other logic circuits and the number of loads therein are calculated in the same manner as that mentioned above.

Figure 37:
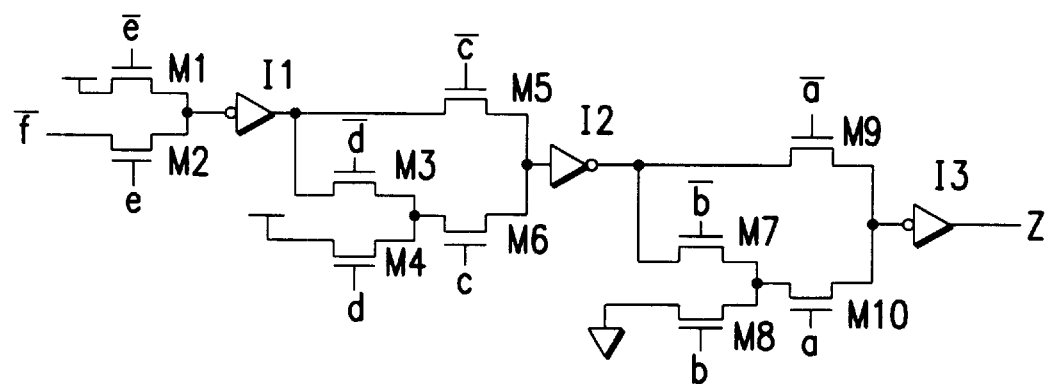
FIG. 37 is a circuit diagram of an example of a known pass transistor logic circuit for calculating the logical operation provided as the expression (40)

A known pass-transistor logic circuit for calculating the logical operation given as the expression (40) has the configuration shown in FIG. 37. Here, from the viewpoint of practical application, restrictions A1 and A2 below are imposed on the configuration of the pass-transistor logic circuit.

A1: up to two stages of pass transistors can be connected in series with each other, and A2: an output signal of a pass-transistor logic circuit must be pulled up or down.

In practice, in order to clear the restrictions A1 and A2, a pass-transistor logic circuit is divided in units including at most two stages. These units are connected using an inverter serving as a pull-up circuit. The number of pass steps in this circuit is eight, and the number of transistors is 16. The number of loads is 13.

As apparent from comparison of FIG. 36 with FIG. 37, for calculating a relatively simple 25 multi-variable sum of products given as the expression (40), the known pass-transistor logic circuit is inferior to the CMOS logic circuit in all aspects, that is, in terms of the number of pass steps, the number of transistors, and the number of loads. In particular, the pass-transistor logic circuit shown in FIG. 37 suffers from a large number of pass steps. Its delay time is therefore approximately 2.7 times as long as that in the CMOS logic circuit shown in FIG. 36.

Figure 38:
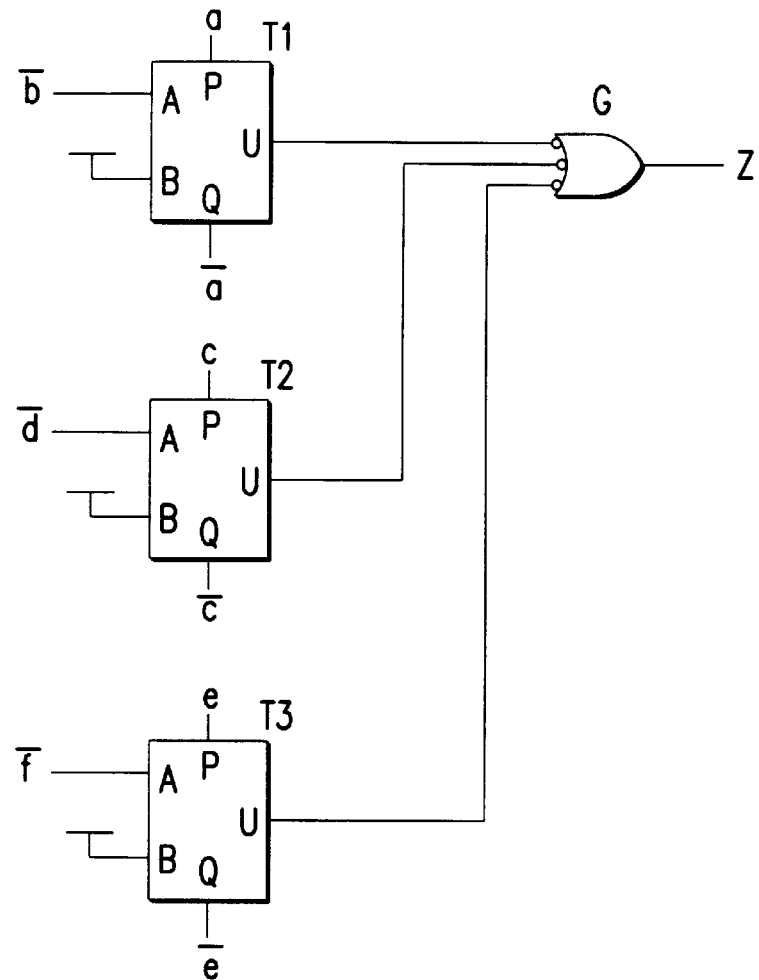
FIGS. 38 and 39 are circuit diagrams of an example of a logic circuit of the present invention for calculating the logical operation provided as the expression (40)
Figure 39:
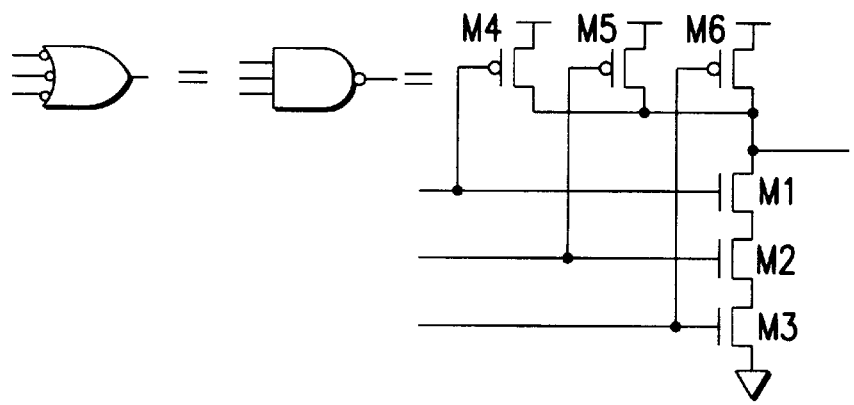

By contrast, a logic circuit of the present invention for calculating the logic operation given as the expression (40) is shown in FIGS. 38 and 39. The logic circuit has three single-stage pass-transistor logic trees. Intermediate logic signals provided by the pass-transistor logic trees are input to a triple-input CMOS zero OR gate (NAND gate) G through corresponding intermediate input nodes thereof. Heroin, the zero OR gate G is, as shown in FIG. 39, composed of N-channel MOS transistors M1 to M3 and P-channel MOS transistors M4 to M6.

The number of pass steps in the logic circuit of the present invention is different between when an output logic signal rises and when it falls, and ranges from 2 to 4. The number of transistors is 13. The number of loads is ten. Note that, a P-channel MOS transistor in each unit pass transistor is presumed to make a contribution, which is ⅕ of the contribution made by an N-channel MOS transistor in the unit pass transistor, to the number of transistors and the number of loads.

The performance factor of the logic circuit of the present invention shown in FIGS. 38 and 39 is substantially identical to that of the CMOS logic circuit shown in FIG. 36. Here, what is referred to as "performance factor" is defined as 1/{(number of transistors)×(number of pass steps)×(number of loads)}. The larger the performance factor is, the better or more excellent the performance is. However, the CMOS logic circuit shown in FIG. 36 can realize only the logic given as the expression (40). By contrast, the logic circuit of the present invention makes it possible to add three product terms of ($\bar{a}\cdot g+\bar{c}\cdot h+\bar{e}\cdot i$) as provided below. That is to say, a more complex logical operation can be expressed by the same logic circuit.

$$Z=a\cdot b+c\cdot d+e\cdot f+\bar{a}\cdot g+\bar{c}\cdot h+\bar{e}\cdot i \qquad (41)$$

The performance factor of the logic circuit of the present invention is approximately four times as excellent as that of the known pass-transistor logic circuit.

Figure 40:
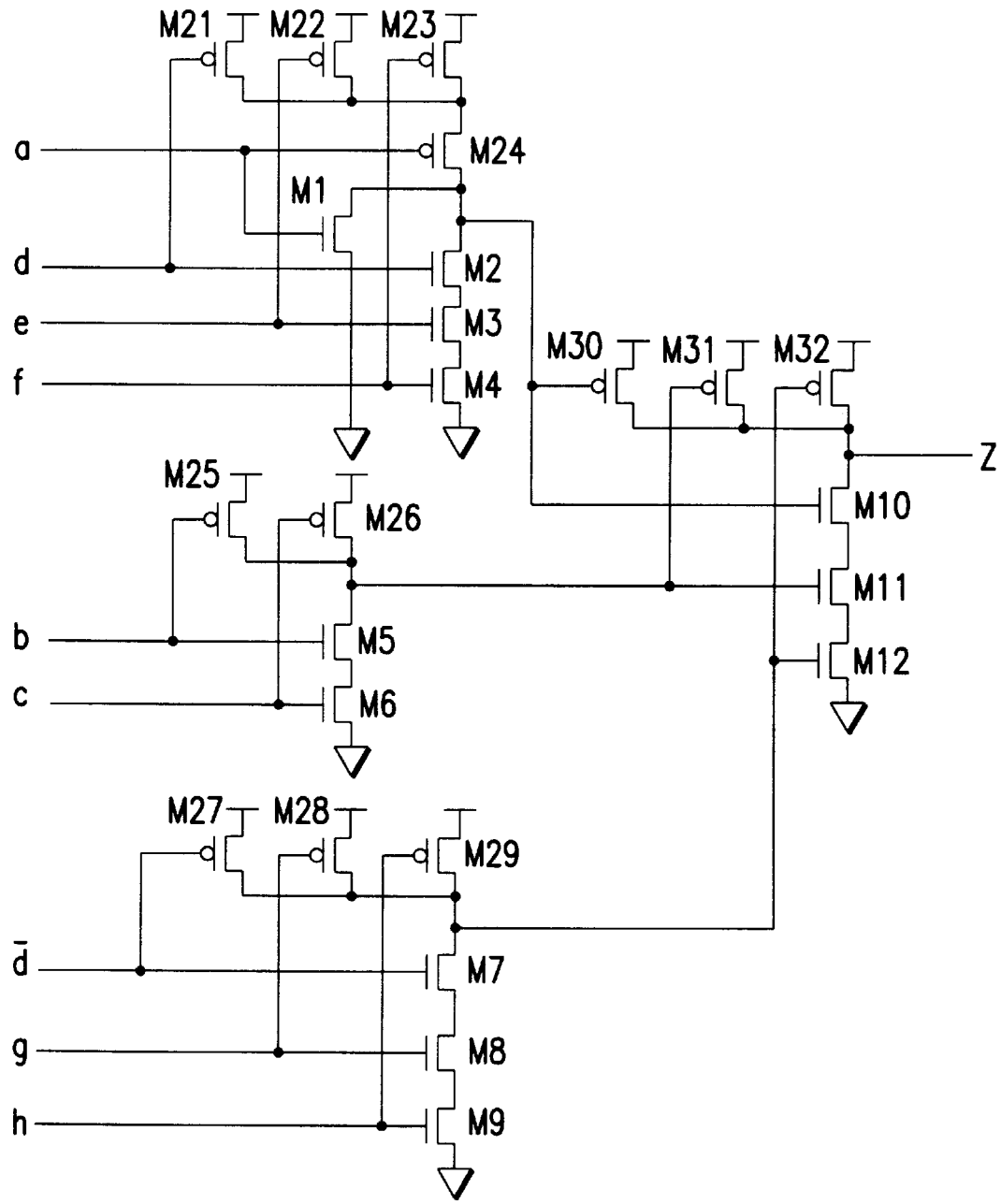
FIG. 40 is a circuit diagram of an example of a known CMOS complex gate for calculating a logical operation provided as an expression (42)

A CMOS complex gate for calculating a logical operation given as an expression below is shown in FIG. 40. The number of pass steps in this logic circuit is four, and the number of transistors is 24. The number of loads is eight.

$$Z=a+b\cdot c+d\cdot e\cdot f+\bar{d}\cdot g\cdot h \qquad (42)$$

Figure 41:
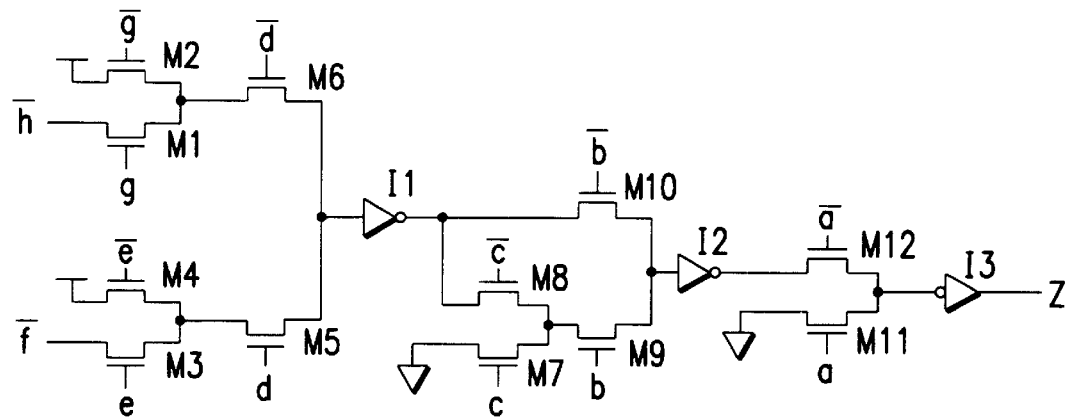
FIG. 41 is a circuit diagram of an example of a known pass transistor logic circuit for calculating the logical operation provided as the expression (42)

A known pass-transistor logic circuit for calculating the logical operation given as the expression (42) is configured as shown, for example, in FIG. 41. The number of pass steps in this circuit is eight, and the number of transistors is 18. The number of loads is 13. The number of transistors in the pass-transistor logic circuit is ¾ of that in the CMOS logic circuit shown in FIG. 40, but a delay time is approximately twice as long as that in that circuit.

Figure 42:
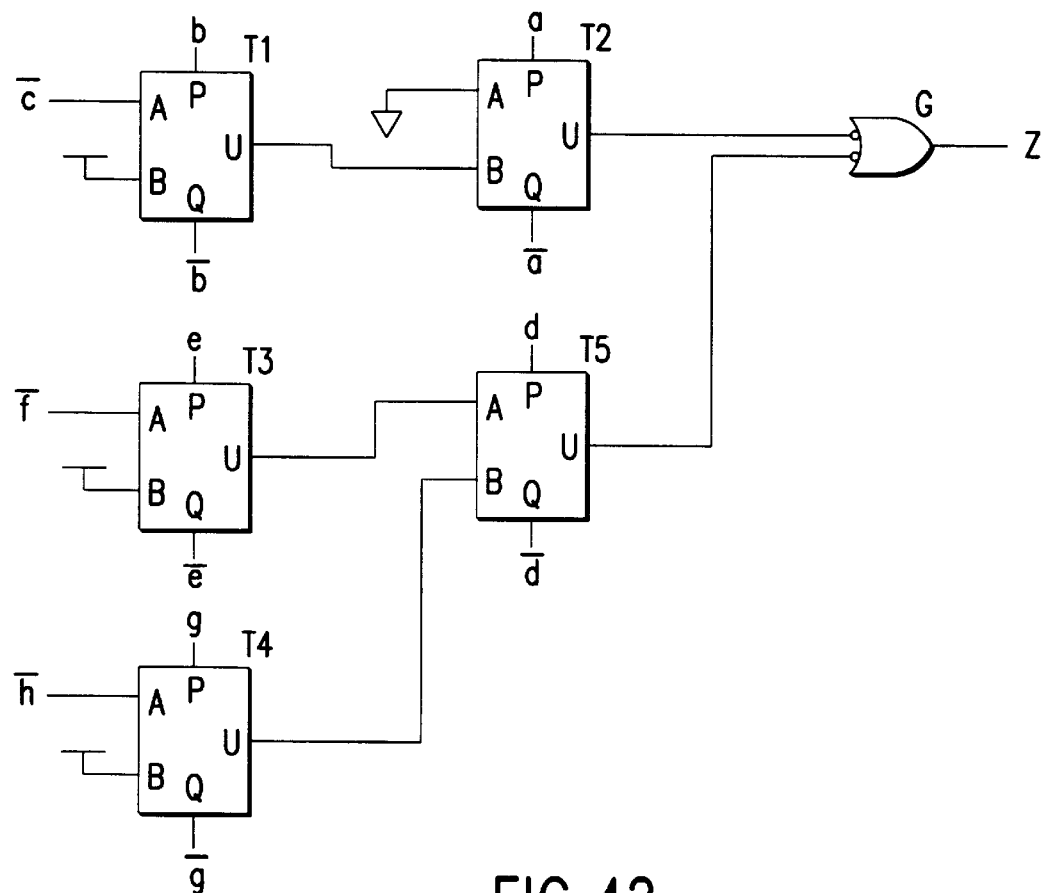
FIGS. 42 and 43 are circuit diagrams of an example of a logic circuit of the present invention for calculating the logical operation provided as the expression (42)
Figure 43:
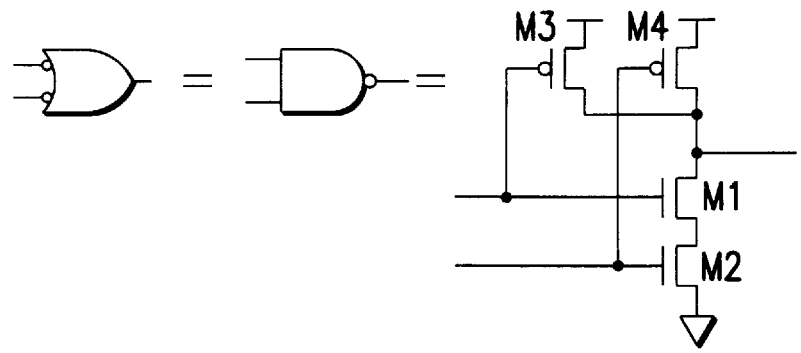

A logic circuit of the present invention for calculating a logical operation given as the expression (42) is shown in FIGS. 42 and 43. A dual-input zero OR gate shown in FIG. 43 is used as a multiple-input logic gate. The number of pass steps in the logic circuit is three or four, and the number of transistors is 16. Here, a P-channel NOS transistor constituting each pass transistor is presumed to make a contribution that is ⅕ of the contribution made by an N-channel MOS transistor constituting the pass transistor. The number of-loads is 13.

The performance factor of the logic circuit of the present invention is substantially identical to that of the known CMOS logic circuit shown in FIG. 40 for calculation of the same logical operation. However, the number of transistors is smaller by approximately 30%. From the viewpoint that reducing chip area is possible the logic circuit of the present invention is superior to the known CMOS logic circuit. The logic circuit of the present invention shown in FIGS. 42 and 43 makes it possible to add up to three product terms to all the product terms dealt with by the CMOS complex gate. Specifically, a logical operation given by an expression below can be calculated.

$$Z=a+b\cdot c+d\cdot e\cdot f+\bar{d}\cdot g\cdot h+\bar{a}\cdot \bar{b}\cdot i+d\cdot \bar{e}j+\bar{d}\cdot \bar{g}\cdot k \qquad (43)$$

The performance factor of the logic circuit of the present invention is approximately 2.6 times as excellent as that of the known pass-transistor logic circuit shown in FIG. 41.

An existing CMOS logic circuit, a known pass-transistor logic circuit, and a logic circuit of the present invention, for expressing a negative logic, will be compared with one another.

Figure 44:
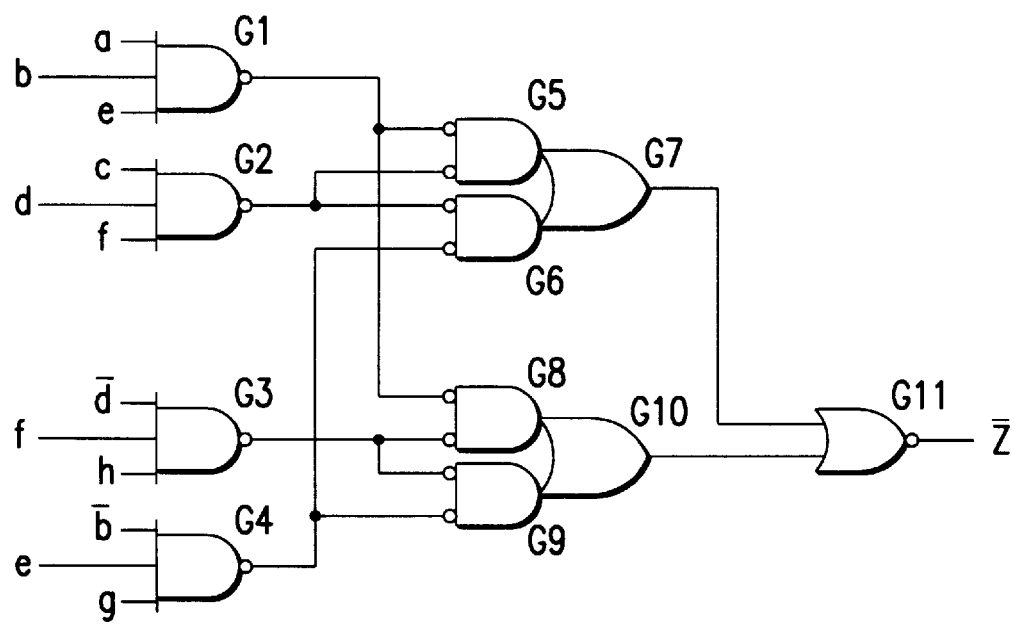
FIG. 44 is a circuit diagram of an example of a known CMOS complex gate for calculating a logical operation provided as an expression (44)

For example, a complex gate shown in FIG. 44 calculates a logical operation given as the following expression:

$$\bar{Z}=a\cdot b\cdot c\cdot d\cdot e\cdot f+a\cdot \bar{b}\cdot \bar{d}\cdot e\cdot f\cdot h+\bar{b}\cdot c\cdot d\cdot e\cdot f\cdot g+\bar{b}\cdot \bar{d}\cdot e\cdot f\cdot g\cdot h \qquad (44)$$

Herein, the number of pass steps in the circuit shown in FIG. 44 is five or six, and the number of required transistors is 44. The number of loads is eight.

Figure 45:
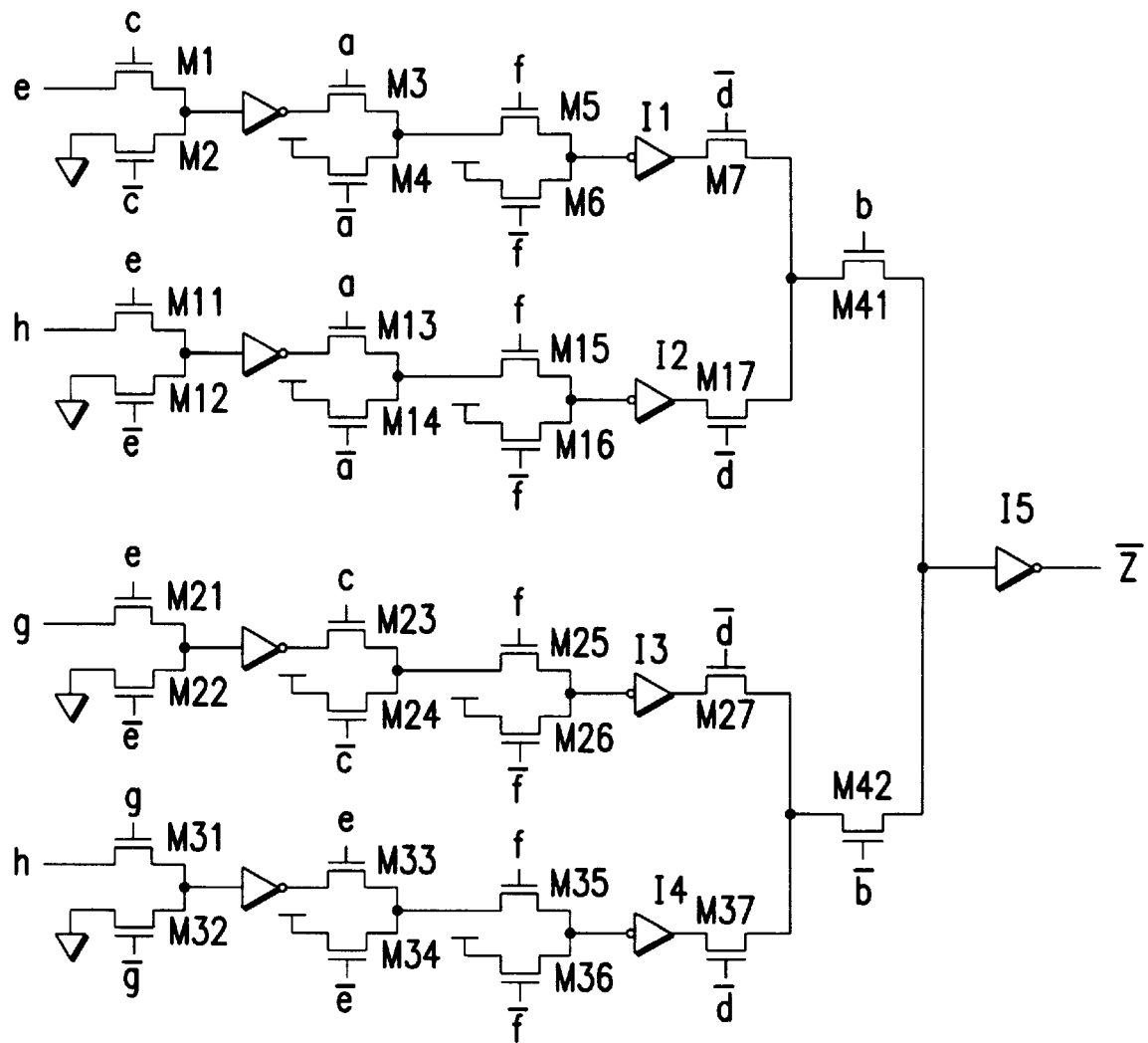
FIG. 45 is a circuit diagram of an example of a known pass transistor logic circuit for calculating the logical operation provided as the expression (44)

A known pass-transistor logic circuit for calculating the expression (44) is shown in FIG. 45. The number of pass steps in this circuit is eight, and the number of transistors is 48. The number of loads is 12. The known pass-transistor logic circuit shown in FIG. 45 is inferior to the CMOS logic circuit shown in FIG. 44 in terms of any of operation speed, power consumption, and chip area. The performance factor of the known pass-transistor logic circuit is approximately ½ of that of the CMOS logic circuit.

Figure 46:
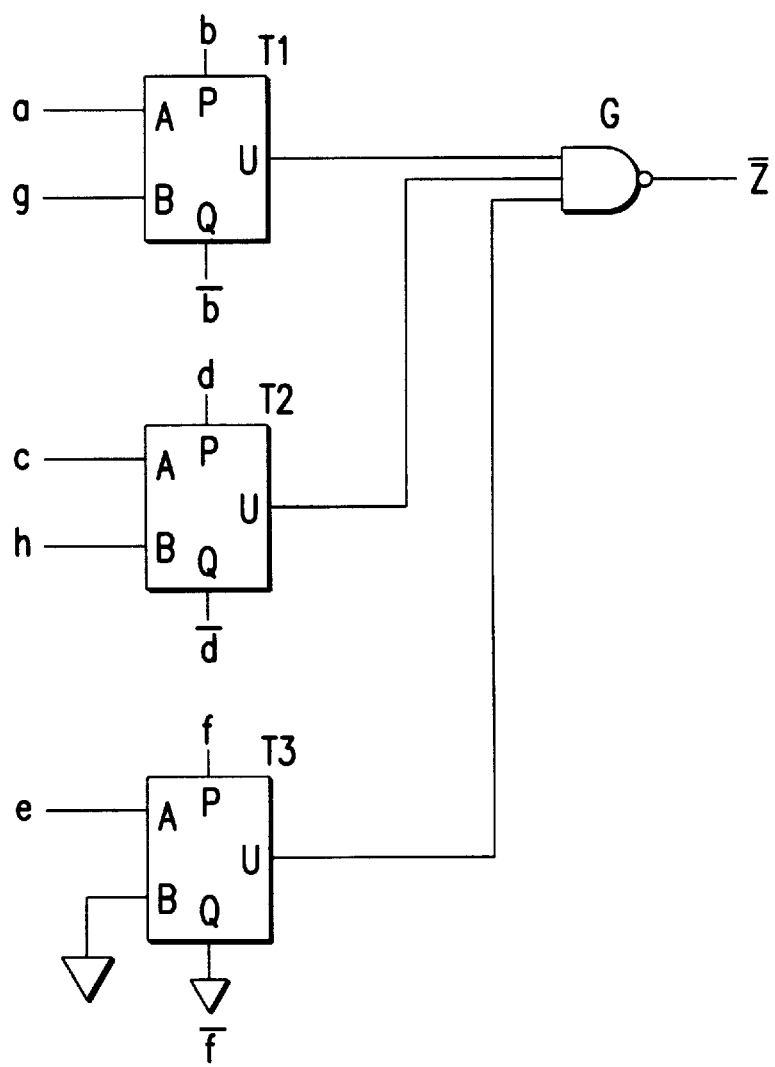
FIG. 46 is a circuit diagram of an example of a logic circuit of the present invention for calculating the logical operation provided as the expression (44).

A logic circuit of the present invention for calculating the logical operation given as the expression (44) is shown in FIG. 46. The details of a triple-input NAND gate shown in FIG. 46 are shown in FIG. 39. The number of pass steps in this circuit is two or four, and the number of transistors is 13.

A P-channel MOS transistor constituting each unit pass transistor is presumed to make a contribution that is ⅓ of the contribution made by an N-channel MOS transistor constituting the unit pass transistor. The number of loads is ten.

As mentioned above, the logic circuit of the present invention shown in FIG. 46 is superior to the CMOS logic circuit shown in FIG. 44 in any of operation speed, power consumption, and chip area. In particular, the number of transistors is approximately ⅓ of that of the CMOS logic circuit. The performance factor of the logic circuit of the present invention is approximately five times as excellent as that of the CMOS logic circuit, and approximately 12 times as excellent as that of the known pass-transistor logic circuit.

Using FIGS. 36 to 46, the logic circuits of the present invention have been compared with the CMOS logic circuits and known pass-transistor logic circuits. Conclusively, conventional pass-transistor logic circuits are not always more advantageous than the CMOS logic circuits. Specifically, the known pass-transistor logic circuits for expressing the expressions (40), (42), and (44) are more disadvantageous than the CMOS logic circuits. By contrast, even for expressing the logical operations which the known pass-transistor logic circuits cannot express efficiently, the performance factors of the logic circuits of the present invention are substantially identical to those of the CMOS logic circuits or are up to 5 times as excellent as those of the CMOS logic circuits. Even a logic circuit of the present invention having substantially the same performance factor as a CMOS logic circuit can express a more complex logic than the same kind of CMOS logic circuit. Compared with conventional pass-transistor circuits, apparently, the performance factor of the logic circuits of the present invention are much higher, in the range of at least 2.6 to 12 times more excellent.

A conventional pass-transistor logic circuit becomes disadvantageous, because the pass-transistor logic circuit is unsuitable for expressing a large number of product terms containing different variables, though it is suitable for expressing a small number of product terms each containing a large number of variables. A logic circuit of the present invention is configured so that intermediate logic signals produced by a plurality of pass-transistor logic trees are input to a multiple-input logic gate through corresponding input nodes thereof. The logic circuit of the present invention can therefore be flexible enough to express many product terms each containing different variables.

Note that a logic circuit of the present invention is not merely a logic circuit in which a pass-transistor logic circuit is used to express a logic that suits the pass-transistor logic circuit and a CMOS logic gate is used to express a logic that suits the CMOS logic gate. In a logic circuit of the present invention, a pass-transistor logic circuit and a multiple-input CMOS logic gate are combined organically. The features of both the pass-transistor logic circuit and multiple-input CMOS logic gate are thus exploited.

It is one of the features of a logic circuit of the present invention that a complex gate designed exclusively for expressing a specific logic such as the one shown in FIG. 36, 40, or 44 is unnecessary. Specifically, only a simple logic gate represented by a NAND gate or NOR gate is used in combination with pass-transistor logic trees to express various logical operations. In respective logic circuits for expressing various logical operations, the ratio of the number of transistors used to form pass transistors to the number of transistors constituting a CMOS logic gate is nearly constant. This feature is exploited when a logic circuit of the present invention is implemented In a gate array integrated circuit in which basic cells each including specified types and numbers of transistors each having specified dimension are arranged in array on a surface of a semiconductor substrate; various logical operations are expressed by defining interconnections within each basic cell; and a desired user function is realized by defining interconnections between the basic cells. This is because both transistors used to form pass transistors and transistors constituting a CMOS logic gate, which are formed at a specified ratio within each basic cell, can be utilized effectively.

As described so far, according to the present invention, a plurality of pass-transistor logic trees and a multiple-input logic gate for receiving intermediate logic signals from the pass-transistor logic trees are combined, whereby a complex logical operation can be expressed while the number of stages in pass-transistor logic trees can be decreased and operation speed can be improved. In particular, various logical operations including such operations that cannot be expressed efficiently by a known pass-transistor logic circuit can be expressed efficiently with performance higher than that is of a known CMOS logic circuit. Furthermore, when a suppressor of a static feedthrough current of the multiple-input logic gate are included, power consumption can be reduced. In some embodiments, the suppressor of a static feedthrough current of the multiple-input logic gate are arranged so that a probability of occurrence of logical collision with a logic circuit in a preceding stage will be decreased or nullified. Power consumption can further be reduced.

The present invention has been described in conjunction with the embodiments. However, the present invention is not limited to the circuits shown as examples. For example, switching devices other than MOS transistors can be used to form pass transistors. In the embodiments, a NAND or NOR gate is used as a multiple-input logic gate. Other logic gate such as the one of the first stage of the composite logic gate shown in FIG. 36 or others can be used. However, for exploiting the features of the present invention made by organically combining a pass-transistor logic circuit and multiple-input logic gate, it is preferable to use a simple logic gate such as a NAND, NOR, AND, or OR gate. Even when a logic circuit of the present invention is used, as mentioned above, as a logic circuit constituting a gate array integrated circuit, it is preferable to use such a simple logic gate. In the embodiments, the number of pass-transistor logic trees in a pass-transistor -logic circuit in equal to the number of intermediate input nodes of a multiple-input logic gate. However, the present invention is not limited to this implementation or mode. The number of intermediate input nodes may be larger than the number of pass-transistor logic trees, and therefore, other logic signals may be input through the intermediate input nodes that do not receive intermediate logic signals.

In practice, for configuring a semiconductor integrated circuit to realize a desired logic function, many logic circuits of the present invention for expressing various logical operations are formed on a surface of a semiconductor substrate, and the logic circuits are interconnected so that the desired function can he realized. An output logic signal to be output through an output node of one logic circuit is therefore input as an input logic signal of a logic circuit in a succeeding stage through an input node thereof. If the length of an interconnection connecting a logic circuit to a logic circuit in a succeeding stage is too long, an output logic signal may be transmitted via a buffer. Furthermore, a logic circuit of the present invention may be used in combination with other types of logic circuits. For example, it is more effective to express a simple logic function such as NAND using a CMOS logic gate.

What is claimed is:

1. A logic circuit comprising:
   at least two pass-transistor logic trees each comprising at least two pass transistors and having at least two input nodes for receiving input logic signals and an intermediate output node for providing an intermediate logic signal;
   a multiple-input complementary logic gate having at least two intermediate input nodes each for receiving the intermediate logic signal from corresponding one of the at least two pass-transistor logic trees, and an output node for providing an output logic signal; and
   a suppressor of a static feedthrough current of the multiple-input complementary logic gate.

2. The logic circuit according to claim 1, wherein said complementary logic gate is a CMOS logic gate.

3. The logic circuit according to claim 1, wherein said suppressor of static feedthrough current comprises means for restoring potentials of the intermediate output nodes of the pass transistor logic trees.

4. The logic circuit according to claim 3, wherein said means for restoring restores the potentials of the intermediate output nodes to at least approximately one of a reference potential and a power supply potential.

5. The logic circuit according to claim 3, wherein said means for restoring restores the potentials of the intermediate output nodes of all the pass-transistor logic trees only when logic states of the intermediate logic signals of all the pass-transistor logic trees are the same.

6. The logic circuit according to claim 3, wherein said means for restoring restores the potentials of the intermediate output nodes of all the pass-transistor logic trees in response to the output logic signal of the multiple-input complementary logic gate.

7. The logic circuit according to claim 6, wherein said multiple-input complementary logic gate is one of an AND, an OR, a NAND and a NOR gate.

8. The logic circuit according to claim 6, wherein
   each of the pass transistors comprises an N channel MOS transistor and said multiple-input complementary logic gate is a CMOS NAND gate; and
   said means for restoring pulls up the potentials of all the intermediate output nodes of all the pass-transistor logic trees to at least approximately a power supply potential when the output logic signal of the CMOS NAND gate is in a LOW state.

9. The logic circuit according to claim 8, wherein
   said means for restoring includes P channel MOS transistors each provided for each of the pass-transistor logic trees; and
   each of the P channel MOS transistors has a gate terminal for receiving the output logic signal of the CMOS NAND gate, a drain terminal connected to the intermediate output node of the corresponding pass-transistor logic tree, and a source terminal for receiving the power supply potential.

10. The logic circuit according to claim 3, wherein
    each of the pass transistors comprises a switching device having a first conduction type and a first driving capacity, and having an input, an output and a control terminal; and
    said means for restoring comprises auxiliary switching devices, each provided for each of the switching devices, each of the auxiliary switching devices having a second conduction type and a second driving capacity which is less than the first driving capacity;
    wherein each of the auxiliary switching devices having an input terminal connected to the input terminal of the corresponding switching device, an output terminal connected to the output terminal of the corresponding switching device, and a control terminal for receiving a complementary logic signal of a logic signal received by the control terminal of the corresponding switching device.

11. The logic circuit according to claim 10, wherein the second driving capacity is less than about ⅓ of the first driving capacity.

12. The logic circuit according to claim 10, wherein the second driving capacity is not greater then about ⅙ of the first driving capacity.

13. The logic circuit according to claim 10, wherein the second driving capacity is not greater than about 1/15 of the first driving capacity.

14. The logic circuit according to claim 10, wherein said switching devices are N channel MOS transistors each having a first W/L ratio, and the auxiliary switching devices are P channel MOS transistors each having a second W/L ratio which is less than the first W/L ratio.

15. The logic circuit according to claim 14, wherein the second W/L ratio is not larger than about ½ of that of the first W/L ratio.

16. The logic circuit according to claim 14, wherein the second W/L ratio is not larger than about ⅕ of that of the first W/L ratio.

17. The integrated circuit device according to claim 10, wherein
    each of the pass transistors has an input, an output and a control terminal; and
    each of the pass-transistor logic trees comprises at least one pair pass transistor element each including a first and a second pass transistor selected from the at least two pass transistors, the output terminals of the pass transistors in each of the at least one pair pass transistor element being coupled.

18. The integrated circuit device according to claim 17, wherein said switching devices are N channel MOS transistors each having a first W/L ratio, and the auxiliary switching devices are P channel MOS transistors each having a second W/L ratio which is less than the first W/L ratio.

19. The integrated circuit device according to claim 18, wherein the control terminal of the auxiliary switching device in the second pass transistor is connected to the control terminal of the switching device in the first pass transistor, and the control terminal of the auxiliary switching device in the first pass transistor is connected to the control terminal of the switching device in the second pass transistor.

20. The logic circuit according to claim 2, wherein
    each of the pass transistors comprises a first conduction type switching device having a first threshold voltage; and
    said suppressor comprises second conduction type switching devices which constitute the multiple-input CMOS logic gate, each of the second conduction type switching devices having a second threshold voltage;
    wherein an absolute value of the second threshold voltage is higher than an absolute value of the first threshold voltage.

21. The logic circuit according to claim 20, wherein said first conduction type switching devices are N channel MOS transistors, and said second conduction type switching devices are P channel MOS transistors.

22. The logic circuit according to claim 21, wherein difference between the absolute value of the second threshold voltage and the absolute value of the first threshold voltage is not less than about 0.7V.

23. A logic circuit comprising:
at least two pass-transistor logic trees each comprising at least two pass transistors and having at least two input nodes for receiving input logic signals and an intermediate output node for providing an intermediate logic signal, each of the pass transistors comprising a switching device having a first conduction type and a first driving capacity, and having an input, an output and a control terminal; and
a multiple-input logic gate having at least two intermediate input nodes each for receiving the intermediate logic signal from corresponding one of the at least two pass-transistor logic trees, and an output node for providing an output logic signal;
wherein each of the pass transistors further comprises auxiliary switching devices each provided for each of the switching devices, each of the auxiliary switching devices having a second conduction type and a second driving capacity which is less than the first driving capacity; and
each of the auxiliary switching devices having an input terminal connected to the input terminal of the corresponding switching device, an output terminal connected to the output terminal of the corresponding switching device, and a control terminal for receiving a complementary logic signal of a logic signal received by the control terminal of the corresponding switching device.

24. The logic circuit according to claim 23, wherein the second driving capacity is less than about ⅓ of the first driving capacity.

25. The logic circuit according to claim 23, wherein the second driving capacity is not greater than about ⅙ of the first driving capacity.

26. The logic circuit according to claim 23, wherein the second driving capacity is not greater than about 1/15 of the first driving capacity.

27. The logic circuit according to claim 23, wherein said multiple-input logic gate is a multiple-input complementary logic gate.

28. The logic circuit according to claim 27, wherein the second driving capacity is less than about ⅓ of the first driving capacity.

29. The logic circuit according to claim 27, wherein the second driving capacity is not greater than about ⅙ of the first driving capacity.

30. The logic circuit according to claim 27, wherein the second driving capacity is not greater than about 1/15 of the first-driving capacity.

31. The logic circuit according to claim 27, wherein said complementary logic gate is a CMOS logic gate.

32. The logic circuit according to claim 31, wherein said switching devices are N channel MOS transistors each having a first W/L ratio, and the auxiliary switching devices are P channel MOS transistors each having a second W/L ratio which is less than the first W/L ratio.

33. The logic circuit according to claim 32, wherein the second W/L ratio is not greater than about ½ of that of the first W/L ratio.

34. The logic circuit according to claim 33, wherein the second W/L ratio is not greater than about ⅕ of that of the W/L ratio.

35. The logic circuit according to claim 31, wherein
each of the pass transistors has an input, an output and a control terminal; and
each of the pass-transistor logic trees comprises at least one pair of pass transistor elements each comprising a first and a second pass transistor selected from the at least two pass transistors, the output terminals of the pass transistors in each of the at least one pair pass transistor element being coupled.

36. The logic circuit according to claim 35, wherein said switching devices are N channel MOS transistors each having a first W/L ratio, and the auxiliary switching devices are P channel MOS transistors each having a second W/L ratio which is less than the first W/L ratio.

37. The logic circuit according to claim 36, wherein the control terminal of the auxiliary switching device in the second pass transistor is connected to the control terminal of the switching device in the first pass transistor, and the control terminal of the auxiliary switching device in the first pass transistor is connected to the control terminal of the switching device in the second pass transistor.

* * * * *

UNITED STATES PATENT AND TRADEMARK OFFICE
CERTIFICATE OF CORRECTION

PATENT NO.    : 5,808,483
DATED         : September 15, 1998
INVENTOR(S)   : Norimitsu Sako It is certified that error appears in the above-identified patent and that said Letters Patent is hereby corrected as shown below:

Column 5,
Line 43, change "pass transistor" to -- pass-transistor --.

Column 6,
Line 66, change "inventors have" to -- inventor has --.

Column 11,
Line 28, change "transistor;" to -- transistors; --.

Column 13,
Line 48, change "$Z=[a \cdot c + b \cdot \bar{c}] \cdot [d \cdot f + e \cdot \bar{f}]$" to --$\bar{Z} = [a \cdot c + b \cdot \bar{c}] \cdot [d \cdot f + e \cdot \bar{f}]$ --.

Column 14,
Line 25, after "Vtn" insert -- + --;
Line 36, change "Vdd" to -- VDD --; and
Line 51-52, delete ", the feedthrough current flows".

Column 15,
Line 12, change "inventors have" to -- inventor has --.

Column 16,
Line 3, change "Fig. 8" to -- Fig. 2 --.

Column 19,
Line 39, change "$\overline{X + Y} = \overline{X} \cdot \overline{Y}$" to -- $\overline{X + Y} = \overline{X} \cdot \overline{Y}$ --.

Column 23,
Line 40, change "$\bar{Z} = \overline{W \cdot X} \cdot Y$" to -- $Z = \overline{W \cdot X} \cdot Y$ --; and
Line 42, change "$(a \cdot c + b \cdot c) \cdot (d \cdot f + e \cdot f) \cdot (g \cdot i + h \cdot i)$" to -- $(a \cdot c + b \cdot \bar{c}) \cdot (d \cdot f + e \cdot f) \cdot (g \cdot i + h \cdot i)$ --

UNITED STATES PATENT AND TRADEMARK OFFICE
CERTIFICATE OF CORRECTION

PATENT NO. : 5,808,483
DATED : September 15, 1998
INVENTOR(S) : Norimitsu Sako

It is certified that error appears in the above-identified patent and that said Letters Patent is hereby corrected as shown below:

"Please amend claims 3 and 17-19 to read:"
 3. The logic circuit according to claim 1, wherein said suppressor of static feedthrough current comprises means for restoring potentials of the intermediate output nodes of the pass-transistor logic trees.

17. The logic circuit according to claim 10, wherein each of the pass transistors has an input, and output and a control terminal; and
  each of the pass-transistors logic trees comprises at least one pair pass transistor element each including a first and a second pass transistor selected from the at least two transistors, the output terminals of the pass transistors in each of the at least one pair pass transistor element being coupled.

18. The logic circuit according to claim 17, wherein said switching devices are N channel MOS transistors each having a first W/L ratio, and the auxiliary switching devices are P channel MOS transistors each having a second W/L ration which is less than the first W/L ratio.

19. The logic circuit according to claim 18, wherein the control terminal of the auxiliary switching device in the second pass transistor is connected to the control terminal of the switching device in the first pass transistor, and the control terminal of the auxiliary switching device in the first pass transistor is connected to the control terminal of the switching device in the second pass transistor.

Signed and Sealed this

Eleventh Day of December, 2001

*Attest:*

*Attesting Officer*

NICHOLAS P. GODICI
*Acting Director of the United States Patent and Trademark Office*